US006875921B1

(12) United States Patent
Conn

(10) Patent No.: US 6,875,921 B1
(45) Date of Patent: Apr. 5, 2005

(54) CAPACITIVE INTERPOSER

(75) Inventor: Robert O. Conn, Los Gatos, CA (US)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 10/698,690

(22) Filed: Oct. 31, 2003

(51) Int. Cl.$^7$ .............................................. H05K 1/00
(52) U.S. Cl. ....................... 174/52.4; 361/761; 361/763
(58) Field of Search .............................. 174/52.1, 52.4; 361/761, 762, 763, 766, 782, 821; 257/678, 698, 700, 924

(56) References Cited

U.S. PATENT DOCUMENTS

| | | | | |
|---|---|---|---|---|
| 5,633,785 | A | * | 5/1997 | Parker et al. ................ 361/766 |
| 6,137,161 | A | * | 10/2000 | Gilliland et al. ............ 257/678 |
| 6,144,225 | A | | 11/2000 | Lesea |
| 6,477,034 | B1 | * | 11/2002 | Chakravorty et al. .... 361/306.3 |
| 6,683,781 | B2 | * | 1/2004 | Ho et al. ................. 361/301.1 |

OTHER PUBLICATIONS

U.S. Appl. No. 10/377,863, filed Feb. 28, 2003, Trimberger et al.
U.S. Appl. No. 10/698,704, filed Oct. 31, 2003, Conn.
U.S. Appl. No. 10/698,906, filed Oct. 31, 2003, Conn.
Actel Corporation; Application Note "The Actel Extender—Extending the Life of Existing Designs"; Jan. 2002; available from Actel Corporation; pp. 1–4.
Fujipoly; Electronic Packaging Components; downloaded Oct. 10, 2003 from Fujipoly; 4 pages.

* cited by examiner

Primary Examiner—Dean A. Reichard
Assistant Examiner—Carmelo Oliva
(74) Attorney, Agent, or Firm—T. Lester Wallace

(57) ABSTRACT

A capacitive interposer (caposer) is disposed inside an integrated circuit package between a die and an inside surface of the package. Conductive layers within the caposer constitute a bypass capacitor. In a through-hole caposer, micro-bumps on the die pass through through-holes in the caposer and contact corresponding landing pads on the package. As they pass through the caposer, power and ground micro-bumps make contact with the plates of the bypass capacitor. In a via caposer, power and ground micro-bumps on the die are coupled to power and ground landing pads on the package as well as to the plates of the bypass capacitor by power and ground vias that extend through the caposer.

21 Claims, 16 Drawing Sheets

CAPACITIVE INTERPOSER

FIELD OF THE INVENTION

The present invention relates to an interposer disposed inside an integrated circuit package between a die and the package, wherein the interposer provides bypass capacitance, signal redistribution functionality and/or signal termination structures close to the semiconductor die.

BACKGROUND INFORMATION

Systems that include integrated circuit (IC) devices typically include decoupling capacitors (also known as bypass capacitors) as well. A typical decoupling capacitor is a capacitor coupled between the power and ground pins (i.e., terminals) of a packaged IC to reduce noise on the power system within the IC. While in some cases the IC itself includes some decoupling capacitance, the amount of capacitance required is such that one or more additional discrete decoupling capacitors are usually added external to the packaged device.

In the past, the location of these discrete decoupling capacitors was a less important issue. The switching frequency of a device was relatively low, e.g., in the range of hundreds of kHz (kilohertz) to tens of MHz (megahertz). The transient currents within the device were also relatively low. Hence, parasitic inductance in the printed circuit board (PCB) mountings was not an important consideration. For example, for an IC mounted in a medium-performance package, whether leaded or surface-mounted to the PCB, a 0.1 uF (microfarad) decoupling capacitor could typically be mounted on the PCB anywhere within a few inches of the packaged IC.

Many ICs now operate at clock frequencies in the hundreds of MHz. At these higher frequencies, transient currents are significantly higher than in the past, and parasitic inductance is a much more important issue. Parasitic inductance within the capacitors themselves has been reduced by improving the packaging of the capacitors, e.g., by using only surface-mount packages and by reducing the size of the packages. (Smaller packages inherently have a lower parasitic inductance.) Parasitic inductance within the PCB mountings has also been reduced through improved layout techniques, e.g., by using dedicated power planes in the PCB, by improving capacitor land geometries, and by careful placement of the capacitors to reduce the distance between the packaged IC and the capacitors.

However, as operating frequencies continue to increase, even these measures become inadequate. One bottleneck in the current path between a decoupling capacitor and the associated packaged IC are the vias that transport charge from the capacitor lands through the PCB to the power planes, and then from the power planes through the PCB to the device. These vias can contribute parasitic inductance in the range of 1.5 nH (nanohenrys) each. If this via inductance could be reduced or eliminated, providing for high-frequency transient current would be much easier.

Therefore, it is desirable to provide systems and structures that provide decoupling capacitance to IC devices with reduced capacitor parasitic inductance. It is further desirable to reduce via parasitic inductance in these systems and structures.

In addition to the issues set forth above, an active circuit disposed on an integrated circuit die typically draws spikes of current from local power supply lines on the integrated circuit die. An active circuit, for example, can have a VCC power lead that is coupled to a VCC power terminal of the integrated circuit by a power supply line. Where the active circuit is disposed in the center of the integrated circuit die, the power supply line can be quite long.

If the long supply line has only a small resistance and inductance, then the active circuit can draw a spike of supply current through the supply line without a significant drop in the voltage on the VCC power lead of the active circuit. Where the active circuit is disposed in the center of the integrated circuit die, however, the long power supply line can have significant resistance and inductance. Accordingly, the voltage on the VCC power lead of the active circuit drops momentarily when the active circuit draws a spike of current and results in undesirable consequences. Due to the drop in the voltage on the VCC power lead, the active circuit may be momentarily unable to output a digital logic high voltage.

One technique used to prevent such undesirable dips in supply voltage is to provide a bypass capacitor close to the active circuit. When the active circuit draws a spike of supply current, much of this supply current is supplied by the local bypass capacitor, thereby reducing the magnitude of the current spike pulled through the VCC power supply line. By reducing the magnitude of the current spike pulled through the supply line, the magnitude of the associated voltage drop at the VCC power lead of the active device is reduced as well. See, for example, U.S. Pat. No. 6,144,225, entitled "Programmable Integrated Circuit Having Metal Plate Capacitors That Provide Local Switching Energy." The need for bypass capacitance is recognized before a circuit is laid out, and extra bypass capacitance is designed into the integrated circuit.

Unfortunately, power supply problems in certain applications of an integrated circuit are often not properly anticipated during the design stage of the integrated circuit. An integrated circuit design may already be in use in a particular application in the field when problems are first detected and appreciated. Refabricating an integrated circuit is generally a very expensive process. Adding bypass capacitance by redesigning and laying out the integrated circuit can be exceedingly expensive and slow. A less expensive and faster way of providing local bypass capacitance is desired.

In addition to the problem of having to provide bypass capacitance for an already-designed integrated circuit, there also sometimes exists a problem where the interconnections between the terminals on the integrated circuit and signal traces on the printed circuit are to be changed. The printed circuit board may be designed incorrectly such that traces on the printed circuit board are coupled to the wrong integrated circuit package terminals. It would be desirable to be able to correct for this problem without having to redesign and refabricate the printed circuit.

In addition to the bypass capacitance and signal redistribution problems set forth above, problems with impedance mismatch sometimes exist. For example, where the output impedance of a driving circuit on an integrated circuit differs significantly from a characteristic impedance of a signal line onto which the driving circuit drives a signal, undesirable reflections may be generated. The signal line may, for example, be a signal line on a printed circuit board, where the integrated circuit is a packaged integrated circuit disposed on the printed circuit board. Similar undesirable reflections may also be generated where the input impedance of a receiving circuit on the integrated circuit differs significantly from a characteristic impedance of a signal line through which the signal is supplied to the receiving circuit.

Although termination resistors can sometimes be provided to match input and output impedances to signal line impedances, there is sometimes not enough physical space on the printed circuit board to accommodate additional discrete components close to the integrated circuit. Even if there is enough physical space to provide such additional components adequately close to the integrated circuit, doing so involves refabricating the printed circuit, board to provide solder pads to which the additional discrete components can be attached. A solution to such impedance mismatch problems is desired that overcomes the space problem and that does not involve refabricating the printed circuit board.

SUMMARY

A capacitive interposer (caposer) having a thin, wafer-like, planar form is disposed inside an integrated circuit package. The caposer is sandwiched between an inside upper surface of the package and a surface of an integrated circuit die. A plurality of through-holes extends through the caposer. The through-hole caposer is mounted to the die such that micro-bumps on the surface of the die pass through the through-holes in the caposer and make contact with corresponding landing pads on the inside upper surface of the package. The micro-bumps may, for example, be one hundred microns or less in diameter. The caposer is therefore made very thin (for example, eighty microns thick) so that metal of the micro-bumps extends down from the die above, all the way through the through-holes in the caposer, and makes contact with landing pads on the inside of the package below.

A first of the micro-bumps is coupled to a power supply line (power supply conductor or power plane) in the die. This first micro-bump also makes contact with a first conductive layer in the caposer. A second of the micro-bumps is coupled to a ground line (ground conductor or power plane) in the die. This second micro-bump also makes contact with a second conductive layer in the caposer. The first and second conductive layers in the caposer are the plates of a bypass capacitor. When an active circuit on the die switches and draws a spike of supply current through the power supply line, at least a portion of that supply current is supplied by the bypass capacitor in the caposer.

If a particular integrated circuit design is already in use in a particular application in the field and exhibits power supply problems, then the integrated circuit design does not have to be changed in order to solve the problem. Rather, when subsequent integrated circuits of the existing integrated circuit design are assembled and packaged, a suitable through-hole caposer is provided in the package along with the die. As described above, the through-hole caposer provides the needed bypass capacitance. Advantageously, this bypass capacitance is provided very close to the die where it is most effective. Due to the bypass capacitance being provided so close to the integrated circuit, the bypass capacitor need not have long inductive leads and therefore can be made to have a low internal series inductance.

Besides providing bypass capacitance, a through-hole caposer can be fashioned to allow a signal on one micro-bump of a die to be redistributed in the lateral dimension to a landing pad on the package located underneath another micro-bump. To perform this redistribution function, a through-hole caposer has a conductive layer that provides a conductive path between the two micro-bumps such that a signal present on a first micro-bump on the die is redistributed in the lateral dimension through the conductive layer in the caposer and to a second micro-bump. The second micro-bump conducts the signal down to a landing pad on the package disposed beneath the second micro-bump. Such a caposer can be used to change the interconnection between the various micro-bumps on a flip-chip integrated circuit die and the various pins or terminals on the integrated circuit package that houses the flip-chip integrated circuit die.

A through-hole caposer can also be used to match circuitry on a die to the characteristic impedance of a trace on a printed circuit board. To perform this impedance matching function, the caposer increases an intervening impedance of a signal path between an output driver on the die and the trace on the printed circuit board. One or more resistive traces can be provided inside the caposer for this purpose. The impedance provided by the caposer increases the intervening impedance. A caposer can therefore be fashioned that causes the sum of the output impedance of the output driver and the intervening impedance of the signal path to be substantially equal to the characteristic impedance of the trace. The caposer therefore reduces impedance discontinuities in a signal path leading out of the integrated circuit and to the printed circuit board.

In a similar fashion, a through-hole caposer can be used to impedance match a receiving circuit on the die to a trace on a printed circuit board through which a signal is being received. Resistive traces within the caposer increase an intervening impedance between the receiving circuit and the trace such that the sum of the input impedance and the intervening impedance is substantially equal to the characteristic impedance of the trace.

In another embodiment, a caposer has vias instead of through-holes. The via caposer is disposed inside the package between an upper inside surface of the package and a surface of an integrated circuit die. A first of the vias is coupled to a first conductive plate within the caposer whereas a second of the vias is coupled to a second conductive plate within the caposer. An active circuit on the die is coupled by a power supply line on the die, through a first micro-bump on the die, down through the first via, and to the first conductive plate within the caposer. A ground line on the die is coupled through a second micro-bump on the die, down through the second via, and to the second conductive plate within the caposer. The first and second conductive plates of the caposer are plates of a bypass capacitor. When the active circuit on the die switches and draws a spike of supply current, at least a portion of that supply current is supplied by the bypass capacitor of the caposer.

In one aspect, vias of a via caposer extend through the caposer from a top surface of the caposer to a bottom surface of the caposer. There is one such via that extends from each of the micro-bumps on the die and down to a corresponding one of a set of landing pads on the package. Because signal conduction through the caposer is provided by these vias, metal from the micro-bumps on the die does not have to extend from the surface of the die above, all the way through through-holes in the caposer, and to the landing pads below. This signal path is instead provided by a via. Accordingly, a via caposer can be made thicker than a through-hole caposer. Because a via caposer can be a relatively thick structure, the often expensive semiconductor processing technologies needed to make a thin caposer are not required. Rather, a via caposer can be made using relatively inexpensive printed circuit board fabrication processes and materials.

A via caposer can also be used to redistribute a signal. In one example, the via caposer contains a conductive layer that redistributes a signal present on a first micro-bump on the die, through the via caposer in the lateral dimension to a second micro-bump on the die, down through a via in the caposer, through a micro-bump on the caposer, and to a landing pad on the package that is located underneath the second micro-bump.

A via caposer can also be used to impedance match circuitry on the die to a characteristic impedance of a transmission line, such as a trace on a printed circuit board. The circuitry on the die has an impedance. A signal path extends between the circuitry on the die, through the caposer, through the package, and to the trace on the printed circuit board. This signal path exhibits an intervening impedance. In one example, an AC load structure is provided within the caposer. This AC load structure adds to the impedance of the circuitry on the die such that the sum of the impedance of the circuitry and the intervening impedance is substantially equal to the characteristic impedance of the trace. In another example, a DC load structure is provided within the caposer. The DC load structure adds to the impedance of the circuitry such that the sum of the impedance of the circuitry and the intervening impedance is substantially identical to the characteristic impedance of the trace. The impedance of the circuitry that is being matched can be an input impedance in the event that a signal is being received onto the die from the trace. The impedance being matched can also be an output impedance in the event that the die is driving a signal out onto the trace. The impedance added by a caposer may involve an resistance placed in series in the signal path.

In some embodiments, a caposer does not include bypass capacitor plates. A caposer can, for example, perform a signal redistribution function without providing a bypass capacitance. A caposer can, for example, perform a impedance matching function without providing a bypass capacitance.

Methods are disclosed for making a structure including a package, a caposer and a die in which a bypass capacitor in the caposer supplies a portion of a supply current drawn by an active circuit in the die.

In another embodiment, each of the through holes of a through-hole interposer is filled with a volume of solder that exceeds the volume of the through hole. Solder protrudes from the upper surface of the interposer to form a bump of solder on the upper surface above the through hole. Solder also protrudes from the bottom surface of the interposer to form a bump of solder on the bottom surface below the through hole. The solder-filled through holes, line up with lands on the face side of a flip-chip die, as well as with landing pads on the inside surface of an integrated circuit package, thereby obviating the need to fabricate micro-bumps on the flip-chip die. Methods are also disclosed of making a solder-filled through-hole interposer.

Additional embodiments and novel aspects are also described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

In the following description, numerous specific details are set forth to provide a more thorough understanding of the present invention. However, it will be apparent to one skilled in the art that the present invention can be practiced without these specific details.

Figure 1:
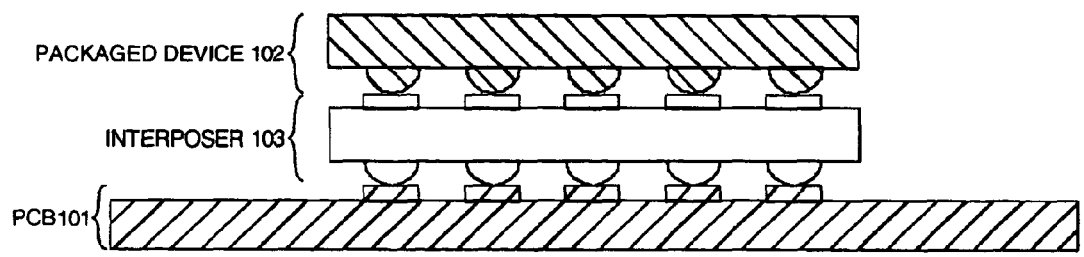
FIG. 1 illustrates a packaged integrated circuit (IC) mounted on a printed circuit board (PCB) using a capacitive interposer according to one embodiment of the invention.

FIG. 1 is a cross-sectional side view of a packaged integrated circuit (IC) 102 mounted on a printed circuit board (PCB) 101 using a capacitive interposer 103 according to one embodiment of the invention. In the pictured embodiment, packaged IC 102 comprises a ball grid array (BGA) package. Interposer 103 is a multi-layered parallel-plate capacitive device having an array of lands on one side and a corresponding array of balls on the other. The balls on the bottom surface of interposer 103 are mounted (e.g., soldered) to lands on PCB 101 using commonly known techniques. Similarly, the balls of packaged IC 102 are mounted (e.g., soldered) to the lands on the top surface of PCB 101.

The lands and balls of the interposer are connected through the body of the interposer using vias that extend from the top surface to the bottom surface. Within the interposer, the facing plates of the capacitors are manufactured using layers of conductive material sandwiched between dielectric layers and selectively coupled to the vias. For example, conductive layers can be coupled to the vias carrying power and ground, while vias carrying other signals (such as clock signals and I/O signals) simply bypass the conductive layers and connect the package pins to the PCB without adding extra capacitance.

Figure 2:
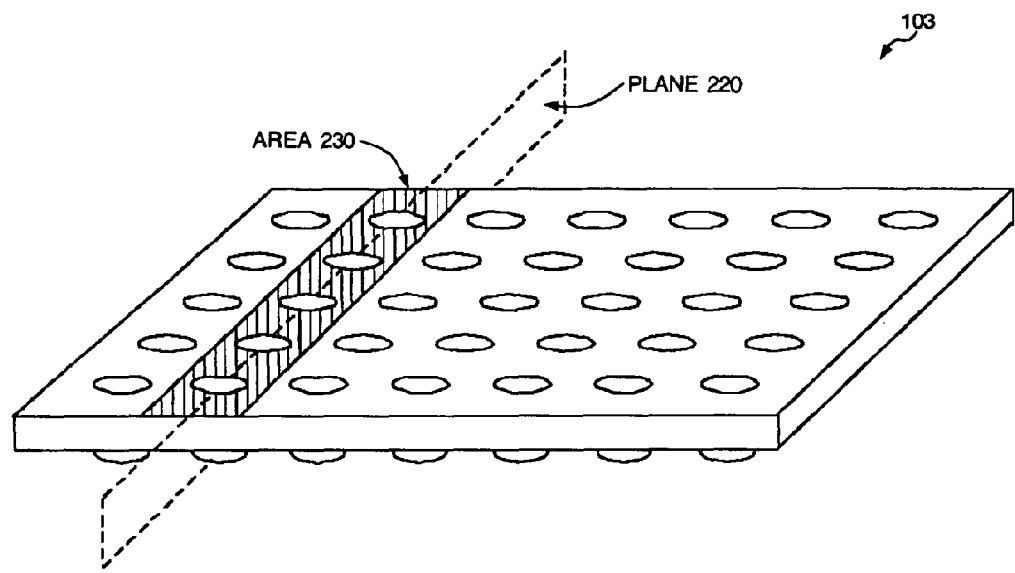
FIG. 2 is a perspective view of a capacitive interposer according to one embodiment of the invention, in which a cutaway plane and view area are delineated.

FIG. 2 is a perspective view of a capacitive interposer, e.g., interposer 103 of FIG. 1. Note that the number of lands and terminals (e.g., balls) in all of the Figures herein is purely illustrative. In practice, the number of lands and terminals could be larger or smaller, but would probably be larger in most cases. In some embodiments, the number of lands and terminals is selected to match the number of terminals on the packaged IC.

The selection of vias to be connected to the conductive layers can also be made based on the location of the power and ground pins of the particular packaged IC. For example, an IC manufacturer can provide for each packaged IC a capacitive interposer designed to provide the correct amount of capacitance to the correct package pins. For example, it is common for the I/O portion and the internal logic portion of an IC to use two different operating voltage levels. Thus, this type of IC would need to add decoupling capacitance between the ground pins and the I/O power pins, and between the ground pins and the power pins used for the internal logic. The present invention allows the manufacture of a capacitive interposer tailored to provide the necessary capacitance specific to each IC product, if desired.

Figure 3:
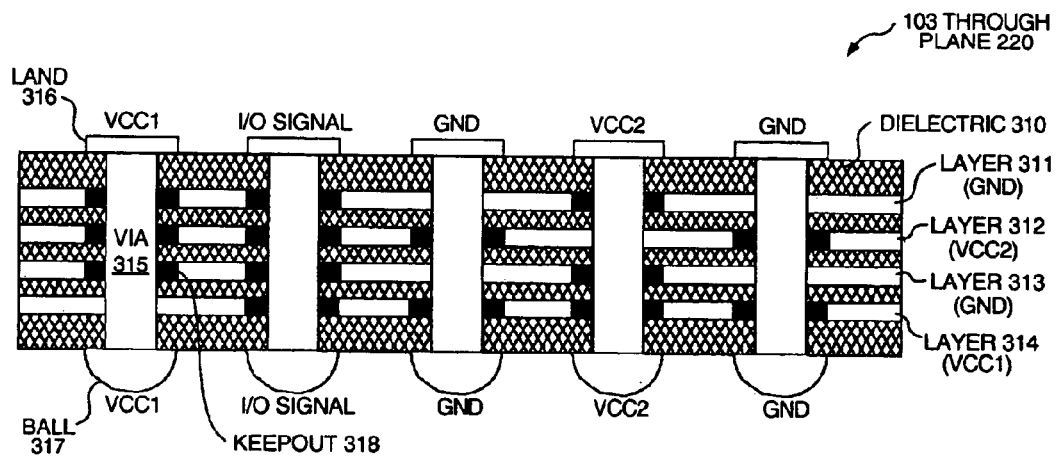
FIG. 3 is a cutaway view of a capacitive interposer according to one embodiment of the invention, through the cutaway plane shown in FIG. 2.

FIG. 2 shows the location of a cutaway plane 220. FIG. 1, for example, shows a view that could be taken along cutaway plane 220. FIG. 3 shows the internal construction of an exemplary capacitive interposer, also along cutaway plane 220.

Figure 4:
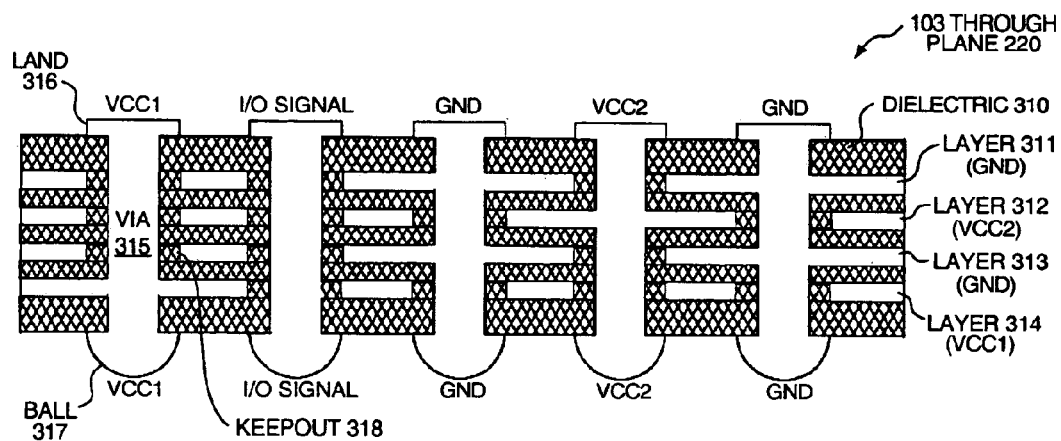
FIG. 4 is a cutaway view of a capacitive interposer similar to that of FIG. 3, but clearly showing the dielectric and conductive areas of the structure.

FIG. 3 shows the internal structural elements of an exemplary interposer according to one embodiment of the invention. Dielectric materials 310 are shown using a cross-hatched pattern. The black areas are keepouts 318, which are also composed of a dielectric material (and can be the same material as materials 310). Conductive materials (conductive layers 311–314, vias 315, lands 316, and balls 317) are shown in clear (no hatching). FIG. 4 is another view of the structure of FIG. 3 that more clearly illustrates the direct current connections within the structure. In FIG. 4, the dielectric materials are shown cross-hatched and the conductive materials are shown in clear.

Referring now to FIG. 3, the two outer layers (the top and bottom layers) of the structure are made up of dielectric material. Between the two outer layers, conductive ground layers (GND, 311 and 313) alternate with conductive power layers (VCC2 312, VCC1 314) to form parallel plate capacitors.

The number of power layers can vary. For ICs having only one power supply, there might be only one power layer. Some power supplies having heavy transient currents might need several conductive layers adjacent to ground layers. The several conductive layers are coupled together through the power vias. Some ICs have more than two power supplies and might require at least one conductive layer for each power supply. For other ICs, some power supplies (those with minimal transient currents) might not require decoupling capacitors. For some ICs, it might be desirable to continue to provide external decoupling capacitors for some power supplies using previously known methods.

Similarly, some ICs have more than one ground, e.g., a digital ground and an analog ground, or an input/output ground and a ground used only for the internal core of the IC. Thus, an interposer according to the invention can include more than one ground and can require at least one conductive layer for each ground.

It will be apparent to one skilled in the art that the invention can be practiced within these and other architectural variations.

The conductive layers are coupled to the desired lands 316 (and hence to the desired pins of the packaged IC) through the vias 315. As can be seen from FIG. 3, a connection is made from the via to a conductive layer only when no keepout is present. For example, the leftmost via in FIG. 3 is coupled to the VCC1 pin of the packaged IC. Keepouts are present for the top three conductive layers (311, 312, and 313), so the via has no electrical contact with these layers. However, no keepout is present for the bottommost conductive layer 314, so this layer is electrically coupled to VCC1.

Similarly, the fourth via from the left is coupled both to the VCC2 pin of the packaged IC and to conductive layer 312. The third and fifth vias from the left are coupled to ground pins of the packaged IC and to conductive layers 311 and 313. In the pictured embodiment, layers 311 and 313 are each coupled to both ground pins. This duplication is desirable to reduce inductance and resistance, thereby providing a more effective decoupling capacitance. The second via from the left is coupled to an I/O signal of the packaged IC and does not contact any of the conductive layers in the interposer structure.

Each of the vias 315 is coupled to an associated ball 317 disposed on the bottom surface of the interposer structure. Thus, each pin of the packaged IC is coupled through the associated via to a corresponding land of the PCB.

The interposer structure of FIG. 3 can be manufactured using conventional manufacturing techniques used, for example, for manufacturing PCBs, IC package substrates, and various types of capacitors. Examples of techniques that can be used include "core panel and pre-preg" techniques commonly used in manufacturing PCBS, "build-up" techniques commonly used in manufacturing IC package substrates, and sintering techniques commonly used in manufacturing capacitors.

FIGS. 5A–7C illustrate the formation of the keepouts 318 shown in FIG. 3. The areas of the layer surfaces shown in FIGS. 5A–7C can correspond, for example, to area 230 delineated in FIG. 2.

Figure 5A:
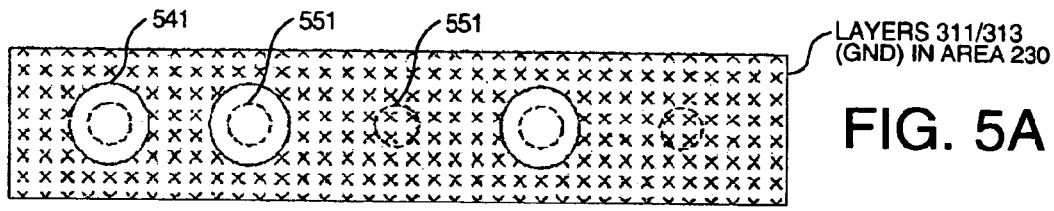
FIGS. 5A–5C illustrate the various conductive layers shown in the cutaway view of FIG. 3, within the view area shown in FIG. 2.
Figure 5B:
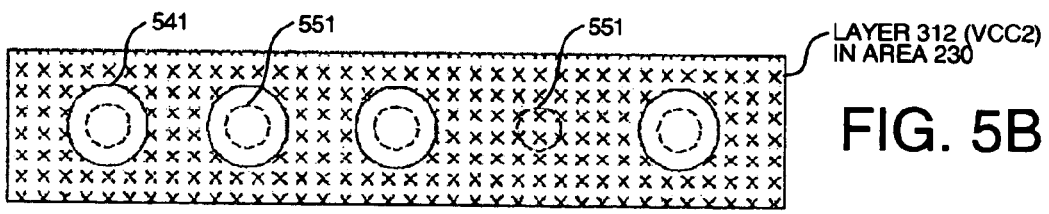
Figure 5C:
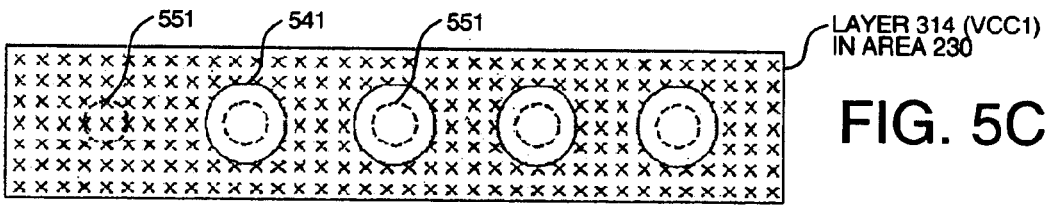

FIGS. 5A–5C show the various conductive layers in the structure of FIG. 3, with the keepout areas shown as clear areas 541 in the conductive material. (The small dashed circles 551 indicate where the vias will later be inserted.) To form the keepout areas, the conductive layers include holes in the conductive material. The conductive layers can be layers of metal, such as copper, for example. In some embodiments, the keepout areas are etched out of a solid layer, as in the core panel and pre-preg technique. In some embodiments, the keepout areas are simply left open when the conducting layer is laid down, as in the build-up technique.

Where a keepout area is present, there will be no electrical connection between the conductive layer and the associated via. FIG. 5A shows conductive layers 311 and 313, which are coupled to the two ground vias shown in FIG. 3. Similarly, FIG. 5B shows layer 312, which is coupled to the VCC2 via in FIG. 3. FIG. 5C shows layer 314, which is coupled to the VCC1 via in FIG. 3.

Adjacent to each keepout area is a dielectric layer, as shown in FIG. 3. In some embodiments, the dielectric material in the adjacent dielectric layer flows into the keepout area, thereby forming the electrically insulating keepout. In some embodiments, the keepout area is filled with dielectric material during the manufacture of the adjacent dielectric layer. In other embodiments, other techniques are used.

Figure 6A:
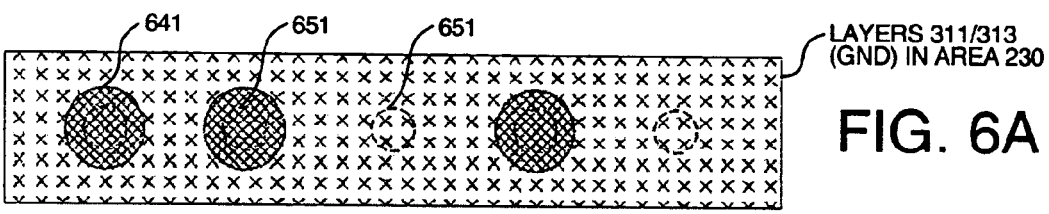
FIGS. 6A–6C show the conductive layers of FIG. 3 after the keepout areas are filled with a dielectric material.
Figure 6B:
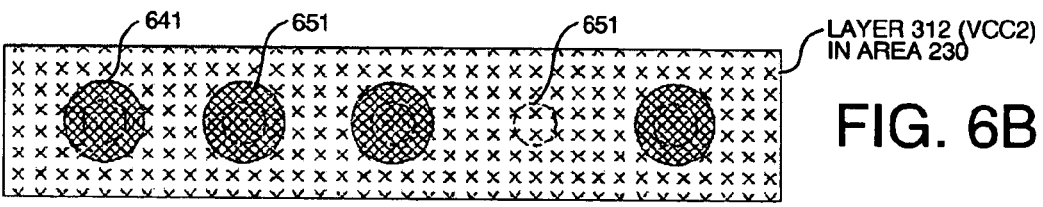
Figure 6C:
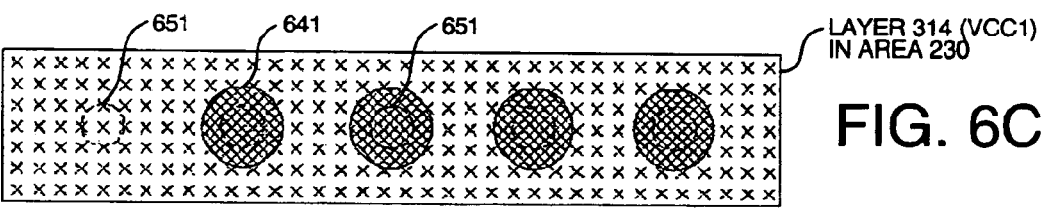

FIGS. 6A–6C show the conductive layers after the keepout areas are filled with dielectric material. The small dashed circles 651 in FIGS. 6A–6C show where the vias will be located. In some embodiments, via holes are drilled when the manufacture of the layered body is complete. In some embodiments, the body is manufactured as two or more separate layered bodies, in which via holes are drilled before the layered bodies are joined to form the complete interposer body. In other embodiments, vias are manufactured using other techniques, such as laser cutting.

Figure 7A:
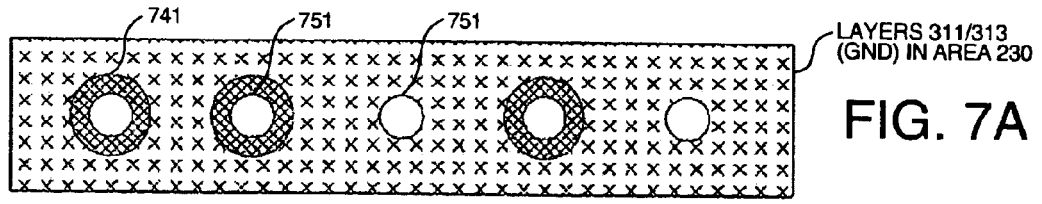
FIGS. 7A–7C show the conductive layers of FIG. 3 after the keepout areas are filled with dielectric material and holes for the vias are drilled.
Figure 7B:
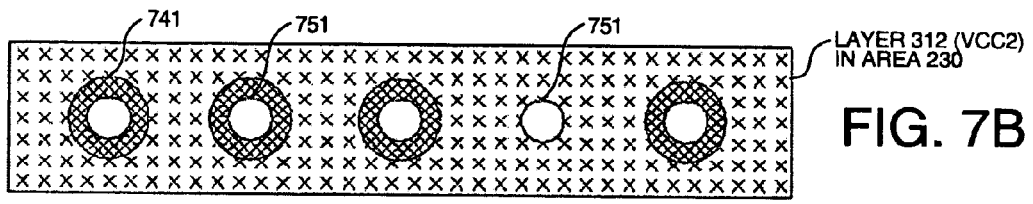
Figure 7C:
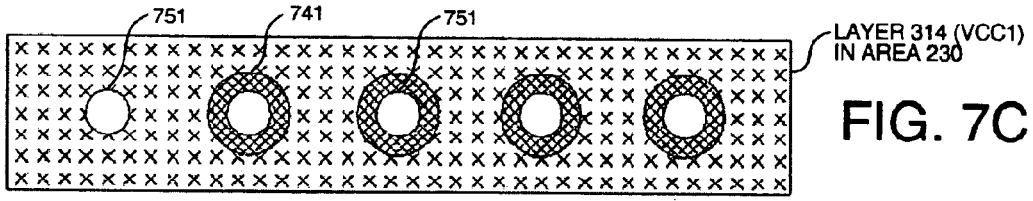

FIGS. 7A–7C show the keepouts 741 in each conductive layer of FIG. 3 after the via holes 751 are drilled.

In some embodiments, the via holes 751 are then plated with a conductive plating material using conventional techniques, and in some embodiments filled with solder. In some embodiments, the balls and/or lands are then applied.

In some embodiments, the capacitive interposer has a comparable footprint to the packaged IC, as shown in FIG. 1. In other embodiments, the capacitive interposer has a larger footprint than the packaged IC. In yet other embodiments, the capacitive interposer has a smaller footprint than the packaged IC.

In some embodiments, the interposer is manufactured as a single unbroken device having a comparable footprint to the packaged IC. This arrangement has the advantage of simplicity, because all of the package pins can be easily connected to the PCB using a single interposer. However, the arrangement can cause problems if the thermal coefficient of expansion varies widely between the interposer and either or both of the packaged IC and the PCB.

PCBs and IC packages are typically made of organic materials. However, it can be desirable to use ceramic insulators to manufacture the interposer. Ceramic insulators typically have a higher dielectric constant than organic insulators, i.e., they can provide greater capacitance using the same thickness of material. However, for larger devices the difference in the thermal coefficients of expansion between the ceramic materials of the interposer and the organic materials of the package and/or PCB can physically stress the soldering between the different structures. Known techniques such as underfill can alleviate this problem. However, some embodiments of the invention use a different technique instead of or in addition to the underfill approach.

In some embodiments, several smaller interposers are used to mount a larger packaged IC to a PCB. When several smaller interposers are used, they can individually expand and/or contract over several smaller areas, rather than experiencing a larger expansion and/or contraction over a single larger area. Thus, the structure can withstand greater variations in temperature without failure.

Figure 8:
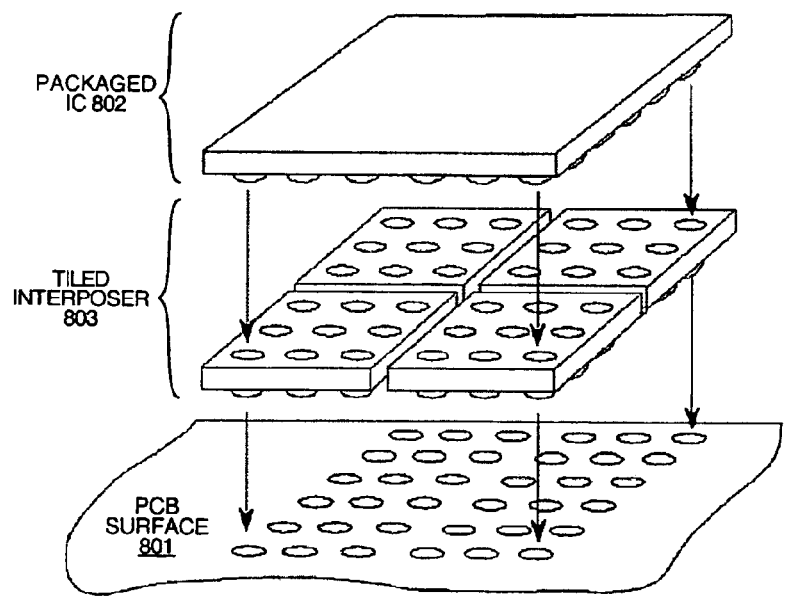
FIG. 8 illustrates how several capacitive interposer structures can be used to couple a single packaged IC to a PCB.

FIG. 8 shows one such embodiment. In the pictured embodiment, the smaller interposers ("tiles") are separately soldered to the packaged IC and to the lands of the PCB. In other embodiments (not shown), the tiles are combined together to form a single interposer device prior to mounting. In one embodiment, an elastomer is used to hold the tiles together, thus forming the single interposer device. The elastomer also serves to absorb mechanical stresses from thermal expansion and/or contraction.

ICs are often manufactured using more than one power supply and/or more than one ground. For example, an IC can use a different power supply (VCC) for each quadrant of the device. Therefore, it can be useful to divide the conductive layers of the interposer to correspond to the power supply divisions on the device, thereby providing two or more separate capacitors using different regions of the same conductive layers. The different regions do not have a direct current connection, but each is capacitively coupled to the ground layers.

Figure 9:
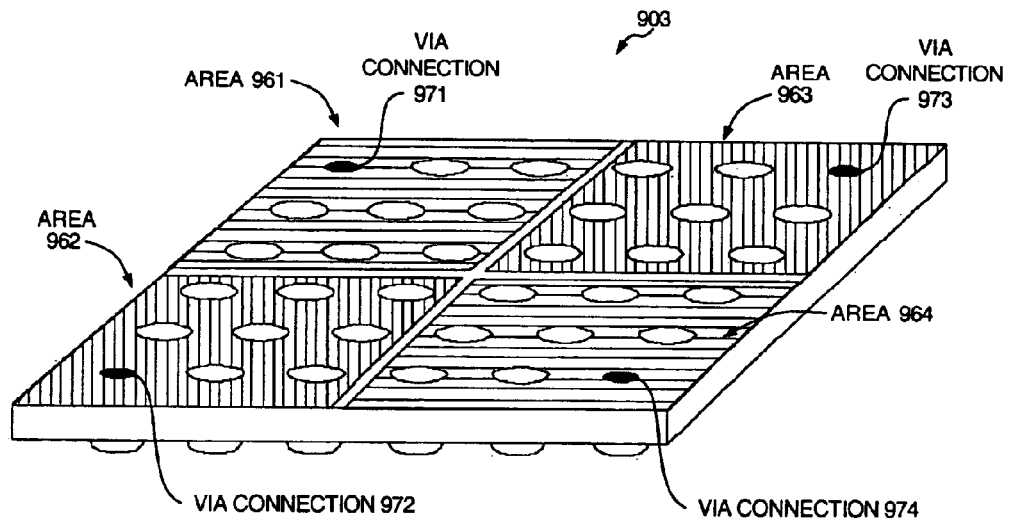
FIG. 9 shows how a single conductive layer can be split up into several areas to implement several different capacitors.

FIG. 9 shows how a single conductive layer can be split up into four quadrants to implement four different capacitors. For example, FIG. 9 shows how the interposer could appear if the top layer of dielectric were removed. In the pictured embodiment, the four areas 961–964 each include one via 971–974 that connects to the power supply for the quadrant.

In some embodiments, some conductive layers are "unified" (manufactured as a single electrical element), and some conductive layers are divided into two or more areas having no direct current connection to each other. In some embodiments, the ground layers are unified and the power layers are divided. In some embodiments, some power supplies share the same conductive layers, while some power supplies have separate unified conductive layers.

Those having skill in the relevant arts of the invention will now perceive various modifications and additions that can be made as a result of the disclosure herein. For example, the above text describes the systems and structures of the invention in the context of ICs packaged in ball grid array (BGA) packages. However, the various embodiments of the invention can also be implemented using other types of IC packages. As another example, the materials and processes described herein are only examples of the materials and processes that can be used to manufacture the structures described herein, including both known materials and processes and materials and processes that have yet to be developed.

Various embodiments are now disclosed in which caposers are disposed inside an IC package as opposed to being disposed outside the IC package between the package and a printed circuit board. For example, a caposer is interposed between an inside surface of a package and a planar bottom surface of a die that is housed in the package. Embodiments are first described in which an array of through holes passes through the caposer. This type of caposer is hereinafter called a through-hole caposer. Embodiments are subsequently described in which conductive vias pass substantially orthogonally through the caposer. This type of caposer is hereinafter called a via caposer.

In certain embodiments of a through-hole caposer, micro-bumps (also known as "flip-chip bumps") are arranged in an array on a planar bottom surface of a die. The micro-bumps pass through corresponding through-holes in the caposer and contact landing pads in a corresponding array on an inside surface of the package. A power supply line in the die couples a first micro-bump on the die to an active circuit in the die. The first micro-bump of the die passes through a through-hole in the caposer while making contact at the edges of the through-hole with a first conductive layer in the caposer. A second micro-bump of the die is coupled to a ground line in the die. The second micro-bump extends through another through-hole in the caposer and makes contact with a second conductive layer in the caposer. The two conductive layers within the caposer are plates of a bypass capacitor. This bypass capacitor supplies a portion of supply current drawn through the power supply line by the active circuit of the die.

Figure 10:
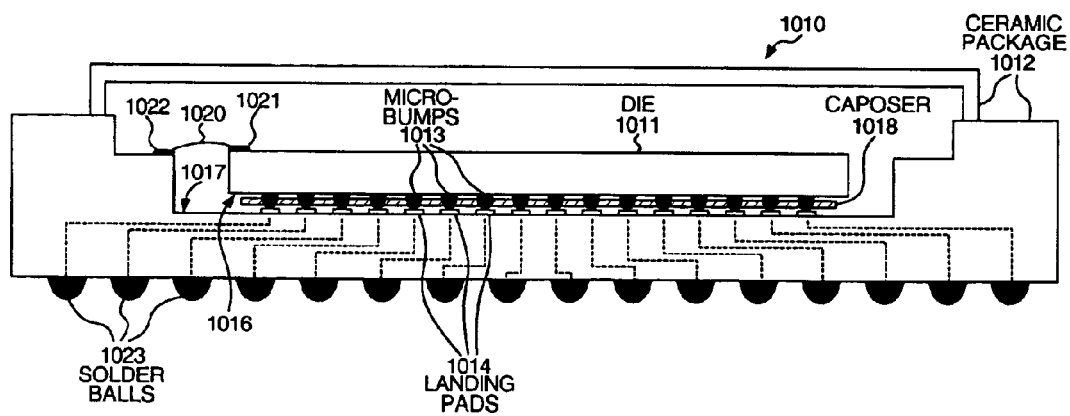
FIG. 10 is a simplified cross-sectional diagram of a caposer disposed beneath a die in a ceramic integrated circuit package in accordance with one embodiment of the present invention.

FIG. 10 is a simplified cross-sectional diagram of a structure 1010 in accordance with an embodiment of a caposer with through-holes. An integrated circuit die 1011 is mounted within an integrated circuit package 1012. In this case, integrated circuit package 1012 is a ceramic package. Micro-bumps 1013 are present in an array on a planar surface 1016 of die 1011. Planar surface 1016 in this example is a face side surface of die 1011. The term "face side" used here denotes the side of the die that receives the bulk of semiconductor processing such that circuitry is fabricated on that face side of the die. Die 1011 is mounted face-side down on an upper surface 1017 of ceramic package 1012 in a flip-chip manner. Each micro-bump in the array of micro-bumps on die 1011 contacts a corresponding landing pad in an array of landing pads 1014 on the inside upper surface 1017 of ceramic package 1012.

A caposer 1018 is disposed between inside upper surface 1017 of ceramic package 1012 and surface 1016 of die 1011. The micro-bumps 1013 of die 1011 fit into and extend through through-holes in caposer 1018 such that the micro-bumps make contact with corresponding landing pads 1014 on package 1012. The through-holes are arranged in the same pattern as the array of micro-bumps 1013.

In this example, input leads and output leads of an active circuit on die 1011 are coupled through ceramic package 1012 to a printed circuit board or another electronic device via solder balls 1023 on the bottom surface of ceramic package 1012. The solder balls 1023 may, for example, be oriented in a ball grid array.

Figure 11:
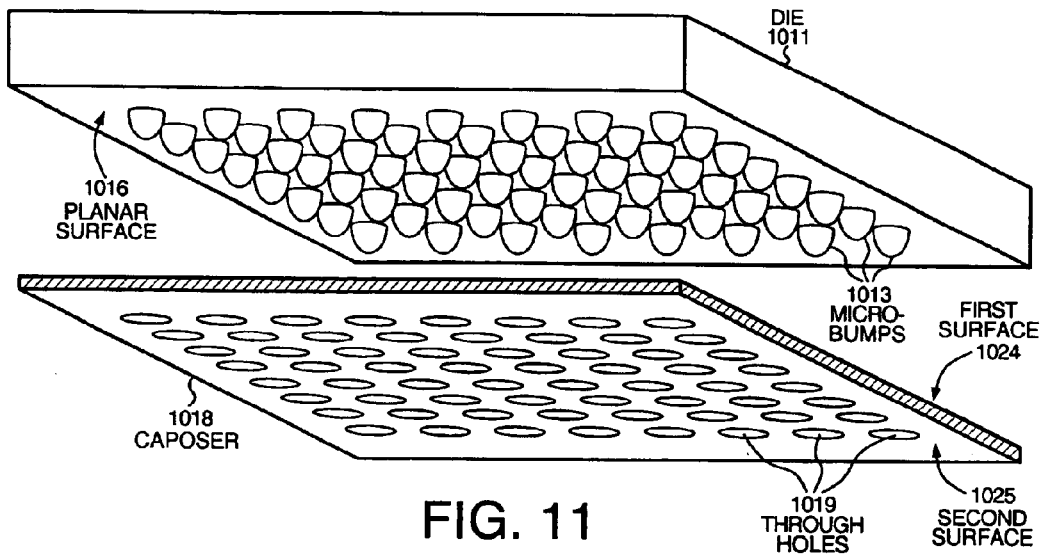
FIG. 11 is an expanded perspective view of the caposer and the die of FIG. 10.

FIG. 11 is an expanded perspective view of caposer 1018 and die 1011 of FIG. 10 showing the through-holes 1019. Caposer 1018 has a planar form with a first surface 1024 adjacent the planar surface 1016 of the face side of die 1011. First surface 1024 has an area that is substantially equal to the area of the planar surface 1016 of die 1011. The through-holes 1019 pass completely through caposer 1018 from first surface 1024 to a second surface 1025 of the caposer. Although caposer 1018 and die 1011 are shown apart for ease of illustration in the expanded view of FIG. 11, it is understood that the micro-bumps 1013 on die 1011 pass through the through-holes 1019 of caposer 1018.

Figure 12:
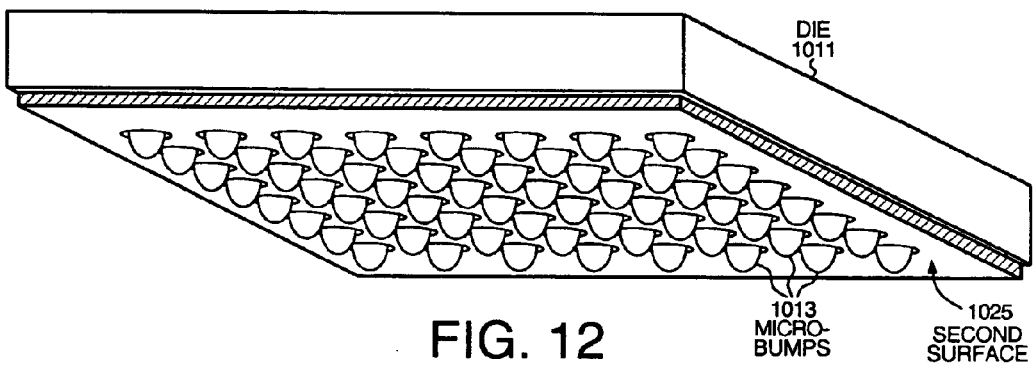
FIG. 12 is a perspective view of micro-bumps on the die of FIG. 10 protruding through through-holes of the caposer.

FIG. 12 is a perspective view of caposer 1018 and die 1011 showing the micro-bumps 1013 protruding through the through-holes 1019 and beyond the plane of second surface 1025.

Figure 13:
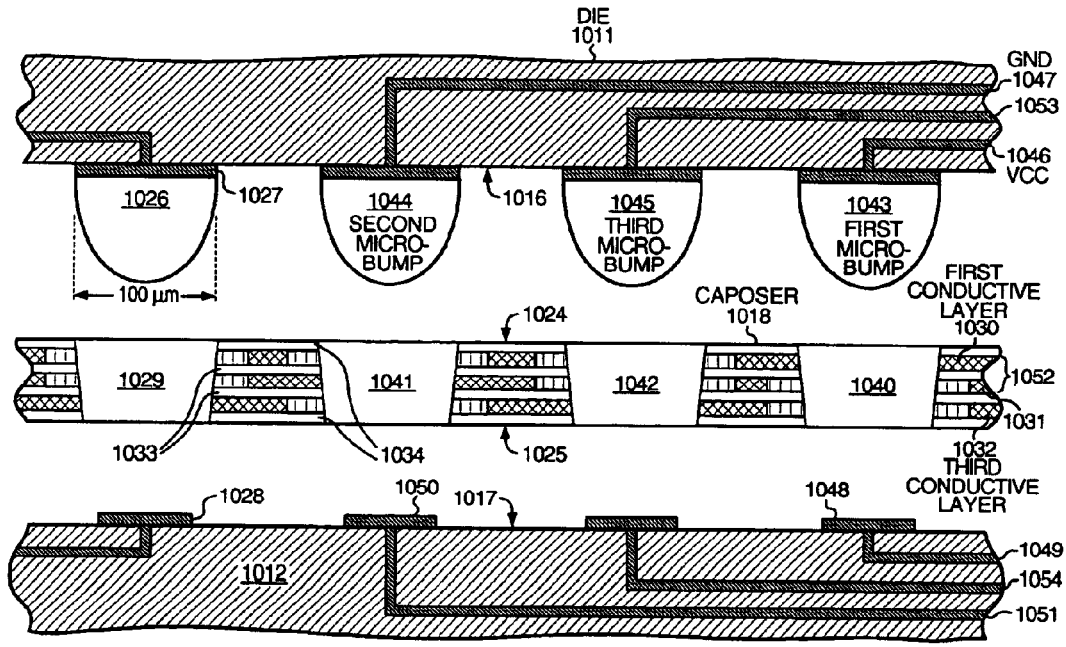
FIG. 13 is an expanded cross-sectional diagram of portions of the die, the caposer and the ceramic package of FIG. 10.

FIG. 13 shows an expanded cross-sectional view of portions of integrated circuit die 1011, caposer 1018 and ceramic package 1012 before die 1011 is mounted onto inside upper surface 1017 of ceramic package 1012. A micro-bump 1026 is shown extending downward from a pad 1027 on die 1011. Before micro-bump 1026 comes into contact with a corresponding landing pad 1028 of ceramic package 1012, micro-bump 1026 has a semi-spherical shape with a diameter of approximately 100 microns (um). Caposer 1018 has a through-hole 1029 with a diameter sufficiently large for micro-bump 1026 to pass through the caposer and to protrude past the plane of second surface 1025. In this embodiment, the diameter of micro-bump 1026 increases slightly with deformation upon mounting so that micro-bump 1026 contacts the walls of through-hole 1029.

Caposer 1018 is a multi-layered parallel-plate capacitive device. Layers of conductive material are interleaved with layers of dielectric material so that the resulting structure is a parallel plate capacitor. FIG. 13 shows a first conductive layer 1030, a second conductive layer 1031 and a third conductive layer 1032 of caposer 1018. Conductive layers 1030, 1031 and 1032 can be made of a metal, such as aluminum or copper, for example. Conductive layers 1030, 1031 and 1032 are separated by a dielectric material 1033. Dielectric material 1033 can be a chemical vapor deposited (CVD) material such as silicon dioxide or silicon nitride, spun on glass, a ceramic material, an organic material, a non-ceramic inorganic material, or even a composite material including epoxy. In addition, caposer 1018 includes an upper outer layer and a lower outer layer. These outer layers are formed of an insulating material 1034. Caposer 1018 can act as a backfill material between die 1011 and ceramic package 1012 if conductive layers 1030, 1031 and 1032, dielectric material 1033 and insulating material 1034 are flexible and conformal.

Caposer 1018 is approximately as thick as the diameter of a micro-bump, for example, one hundred microns. Caposer 1018 therefore may be fragile. In one embodiment, caposer 1018 is fabricated on top of a thicker substrate layer. This thicker substrate can be a monocrystalline silicon wafer substrate. Ion implantation is used to form a weakened layer within the substrate. The layers of caposer 1018 are then formed by semiconductor processing steps on top of the weakened layer. Silicon oxide layers can be deposited with chemical vapor deposition (CVD), and metal layers between the silicon oxide layers can be sputtered and etched. One method of making caposer 1018 involves forming layers starting first from first surface 1024. For example, second layer 1031 is deposited after first layer 1030 is deposited. After the last layer is deposited, second surface 1025 is polished. A sacrificial, support layer is then attached with glue to second surface 1025. Caposer 1018 is then separated from the substrate at the weakened layer. Chemical mechanical polishing (CMP) is used to smooth the surface of caposer 1018 where separation occurred, resulting in first surface 1024. Through-holes are then etched into caposer 1018 through first surface 1024. The glue attaching the support layer is then dissolved away, thereby releasing the thin caposer 1018.

Another way of fabricating caposer 1018 involves fabricating the layers of the caposer on a support structure that can be dissolved away without dissolving the caposer. An example of such a support structure is a wafer of polyimide material. Semiconductor photolithographic processes and chemical vapor deposition processes are used to fashion the various layers of the caposer on the support wafer. Once the caposers are fabricated on the support wafer, the entire structure is placed in a solution that dissolves away the support wafer, thereby releasing the caposers. The caposers can then be retrieved from the solution, dried, and used.

FIG. 13 shows caposer 1018 having three additional through-holes 1040, 1041 and 1042. These through-holes are not completely cylindrical in shape, but rather have different diameters at different depths into caposer 1018 such that micro-bumps make contact with various layers of caposer 1018 as the micro-bumps pass into the through-holes. For example, a first micro-bump 1043 passes into first through-hole 1040, a second micro-bump 1044 passes into second through-hole 1041, and a third micro-bump 1045 passes into third through-hole 1042. First micro-bump 1043 is coupled to a power supply line or power plane (VCC) 1046 of die 1011. Second micro-bump 1044 is coupled to a ground line or ground plane 1047 of die 1011. Ceramic integrated circuit package 1012 includes a first landing pad 1048 coupled to a package power line 1049, as well as a second landing pad 1050 coupled to a package ground line 1051.

Figure 14:
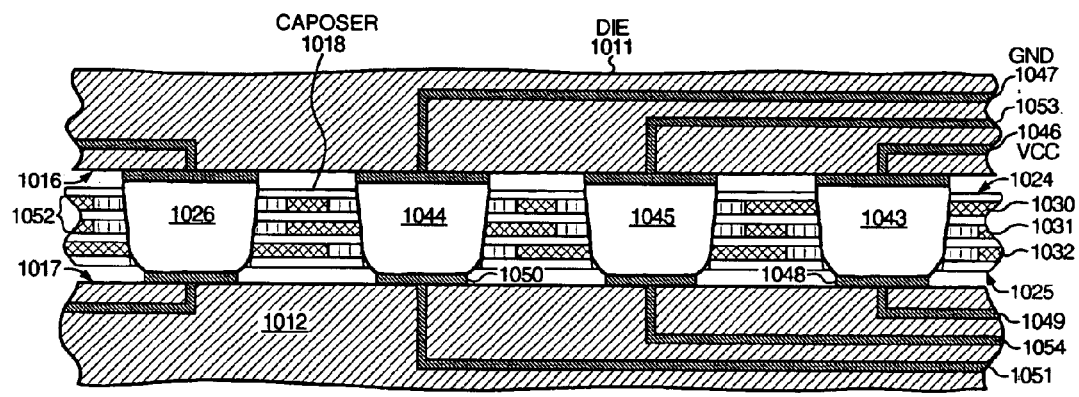
FIG. 14 shows the die, the caposer and the ceramic package of FIG. 13 after mounting.

FIG. 14 shows die 1011, caposer 1018 and ceramic package 1012 after die 1011 has been mounted onto upper surface 1017 of ceramic package 1012. First micro-bump 1043 that passes into first through-hole 1040 makes contact with first conductive layer 1030. Although, first micro-bump 1043 also makes contact with the edge of first through-hole 1040 at the depths of second conductive layer 1031 and third conductive layers 1032, first micro-bump 1043 does not contact second conductive layer 1031 or third conductive layer 1032 because keepout areas of insulating material in those layers surround first through-hole 1040.

Second micro-bump 1044 that passes into second through-hole 1041 makes contact with second conductive layer 1031, but does not contact first conductive layer 1030 or third conductive layer 1032. Keepout areas of insulating material in the first and third conductive layers 1030 and 1032 prevent second micro-bump 1044 from contacting those conductive layers.

During operation of an active circuit on die 1011, first conductive layer 1030 and second conductive layer 1031 function as a bypass capacitor 1052. As the active circuit draws a spike of supply current, supply current passes from package power line 1049, through micro-bump 1043, through power supply line (VCC) 1046, and to the active circuit. Because some resistance and inductance is inherently associated with package power line 1049, first micro-bump 1043 and power supply line (VCC) 1046, the voltage supplied to the active circuit drops as the spike of current is drawn. The drop in voltage is reduced, however, by current that is supplied through first micro-bump 1043 from bypass capacitor 1052.

Reducing surges in power results in a "quieter" power supply, especially for nanosecond clock signals that can develop "clock jitter" when the clock detects the switching point of the clock signal voltage too late. The active circuit to which bypass capacitor 1052 supplies a portion of the spike of current may be an analog circuit, or a digital circuit, or any other type of circuit whose performance can be enhanced by coupling it to a bypass capacitor. The active circuit may, for example, be part of an application specific integrated circuit (ASIC), a field programmable gate array (FPGA), other programmable logic device.

The amount of voltage drop at such an active circuit can, in general, be reduced by reducing the length of the current path from the bypass capacitor to the active circuit. By reducing the distance between the active circuit and the bypass capacitor, it is often possible to reduce the inductance and resistance of the power supply current path between the active circuit and the micro-bump. Reducing the inductance of the power supply current path is especially important where the switching frequency of the active circuit is at a high frequency, e.g., hundreds of MHz. In accordance with one embodiment, first micro-bump 1043 is placed nearer to the active circuit, preferably directly underneath the active circuit, such that a more direct and shorter path is provided from bypass capacitor 1052 to the active circuit on die 1011. Thus, a technique is disclosed that avoids using long-distance power conductors to connect an active circuit in the interior of die to a bypass capacitor.

FIGS. 13 and 14 also illustrate another embodiment. FIG. 14 shows that third micro-bump 1045 makes contact with third conductive layer 1032, but does not contact first conductive layer 1030 or second conductive layer 1031. Third micro-bump 1045 is coupled to a signal lead 1053 of die 1011 and to a signal conductor 1054 of ceramic package 1012. In this example, third conductive layer 1032 couples signal lines. A signal present on signal lead 1053 and on third micro-bump 1045 is also present on other lines that are coupled to other micro-bumps that contact third conductive layer 1032, such as micro-bump 1026. Thus, a portion of third conductive layer 1032 forms an electrically conductive path that re-routes a signal present on a micro-bump at one position of the array of micro-bumps to a different position of the array.

Figure 15A:
FIGS. 15A through 15V are simplified cross-sectional and top-down diagrams of the caposer of FIG. 14 showing steps in forming a through-hole through the caposer.
Figure 15C:
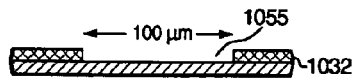
Figure 15E:
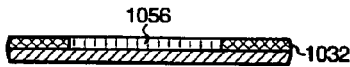
Figure 15B:
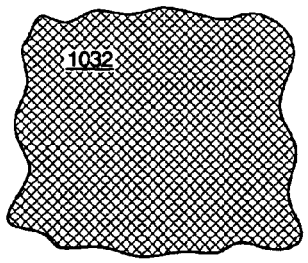
Figure 15D:
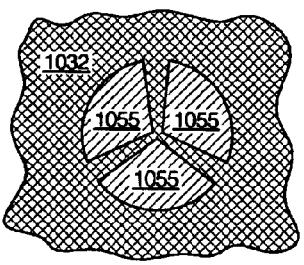
Figure 15F:
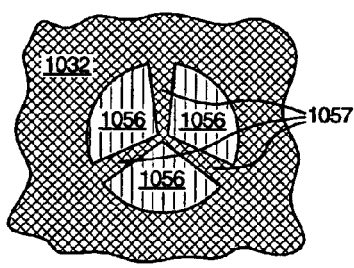
Figure 15G:
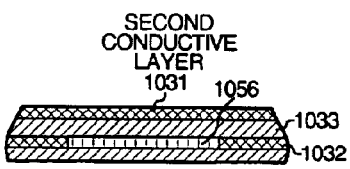
Figure 15I:
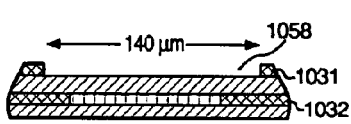
Figure 15K:
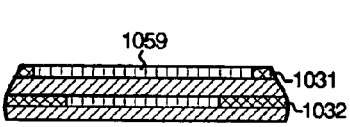
Figure 15H:
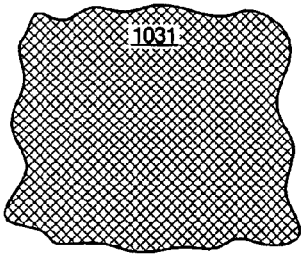
Figure 15J:
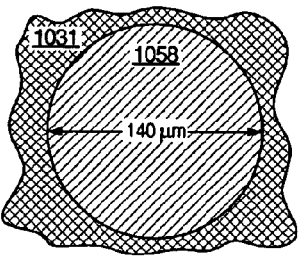
Figure 15L:
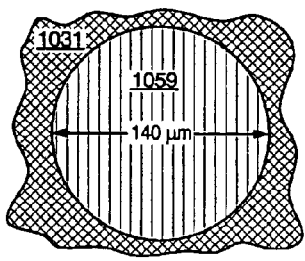
Figure 15M:
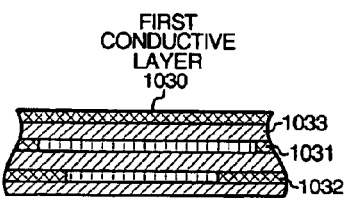
Figure 15N:
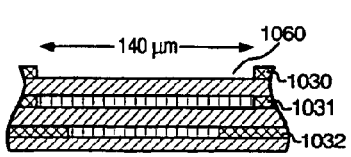
Figure 15O:
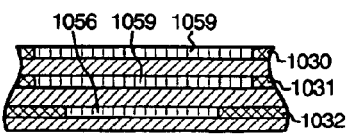
Figures 15P, 15R, 15V:
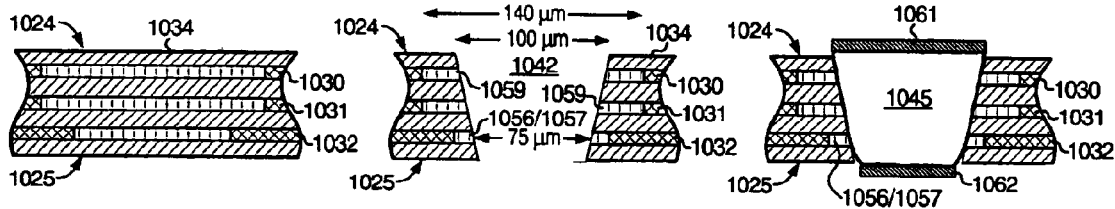
Figure 15Q:
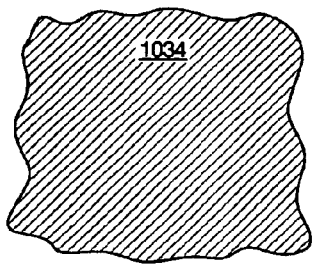
Figure 15S:
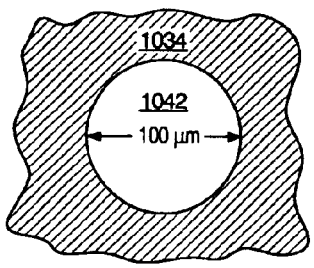
Figure 15T:
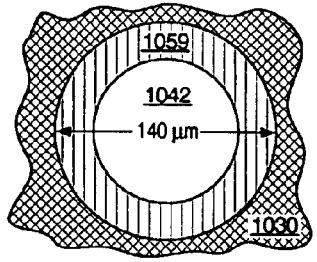
Figure 15U:
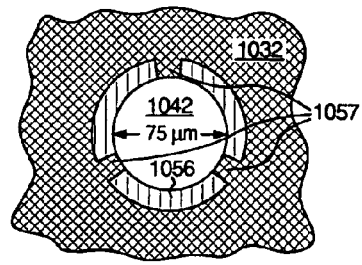

FIGS. 15A through 15U are simplified cross-sectional and top-down diagrams of a portion of caposer 1018 showing various steps in forming third through-hole 1042 of FIGS. 13 and 14. FIG. 15A shows a step in which third conductive layer 1032 of caposer 1018 has been deposited over a layer of insulating material 1034. FIG. 15B is a top-down view of FIG. 15A. In a subsequent step, a hole pattern 1055 is etched into third conductive layer 1032, as shown in FIGS. 15C and 15D.

The hole pattern is then filled with a flexible material 1056 leaving the structure illustrated in FIG. 15E. A layer of the flexible material 1056 may, for example, be deposited over the entire structure and then be planarized leaving an amount of the flexible material in the hole pattern. Third through-hole 1042 will later be etched downward through the middle of the patterned flexible material 1056, and electrical contact will be made between third micro-bump 1045 and spokes 1057 of third conductive layer 1032.

FIG. 15G shows a subsequent step in which second conductive layer 1031 has been deposited over a layer of dielectric material 1033. FIG. 15H is a top-down view of FIG. 15G. In a subsequent step, a keepout area 1058 is etched into second conductive layer 1031, as shown in FIGS. 15I and 15J. In the present embodiment where micro-bumps are approximately one hundred microns in diameter, keepout area 1058 is disk-shaped and has a 140 micron diameter.

FIG. 15K shows that, in a subsequent step, an insulating material 1059 is deposited into keepout area 1055 of FIGS. 15I and 15J. Third through-hole 1042 will later be etched downward through the middle of the disk of insulating material 1059. Thus, a ring of insulating material 1059 will prevent electrical contact between third micro-bump 1045 and second conductive layer 1031.

FIG. 15M shows a subsequent step in which first conductive layer 1030 has been deposited over another layer of dielectric material 1033. In a subsequent step, a keepout area 1060 is etched into first conductive layer 1030, as shown in FIG. 15N. Keepout area 1060 is also disk-shaped and has a 140 micron diameter. In a subsequent step, insulating material 1059 is deposited into keepout area, 1060 of FIG. 15N.

FIG. 15P shows a subsequent step in which the upper outer layer of caposer 1018 has been formed by depositing a layer of insulating material 1034 over first conductive layer 1030. Insulating material 1059 that fills keepout areas and insulating material 1034 that forms the upper outer layer and the lower outer layer of caposer 1018 can be the same low-K dielectric material. FIG. 15Q is a top-down view of FIG. 15P.

FIG. 15R shows how third through-hole 1042 is etched down through caposer 1018 from first surface 1024 all the way through second surface 1025. Third through-hole 1042 is about 100 microns in diameter at first surface 1024 and less than about 75 microns at second surface 1025. FIG. 15S is a top-down view of first surface 1024 of caposer 1018 showing a 100 micron opening of third through-hole 1042.

FIG. 15T is a cross-sectional diagram intersecting caposer 1018 at the depth of first conductive layer 1030. FIG. 15T shows keepout area 1060 (see FIG. 15N) filled with insulating material 1059. Insulating material 1059 in FIG. 15T is ring-shaped because third through-hole 1042 has been etched down through the middle of the disk-shaped keepout area 1060. The diameter of third through-hole 1042 is somewhat less than 100 microns at the depth of first conductive layer 1030. Thus, there is a ring of insulting material 1059 about 20 microns wide around third through-hole 1042.

FIG. 15U is a cross-sectional diagram intersecting caposer 1018 at the depth of third conductive layer 1032. FIG. 15U shows third through-hole 1042 etched through the middle of flexible material 1056 deposited in the shape of pattern 1055. Third through-hole 1042 has a diameter of about 75 microns at the depth of third conductive layer 1032. The structure of third conductive layer with flexible material 1056 around third through-hole 1042 reduces the likelihood that the metal of third conductive layer 1032 will crack due to thermal expansion of third micro-bump 1045. Third micro-bump 1045 (see FIG. 15V) establishes electrical contact with third conductive layer 1032 through spokes 1057 (see FIG. 15U).

FIG. 15V is a cross-sectional view of a portion of caposer 1018 showing third micro-bump 1045 inserted into and through third through-hole 1042. Third-micro bump 1045 is somewhat deformed as it is squeezed between pad 1061 and landing pad 1062. Where die 1011, caposer 1018 and ceramic package 1012 are heated to the point that the metal comprising third-micro bump 1045 becomes molten, the molten metal extends due to surface tension to the lateral edges of both pad 1061 and landing pad 1062.

Figure 16:
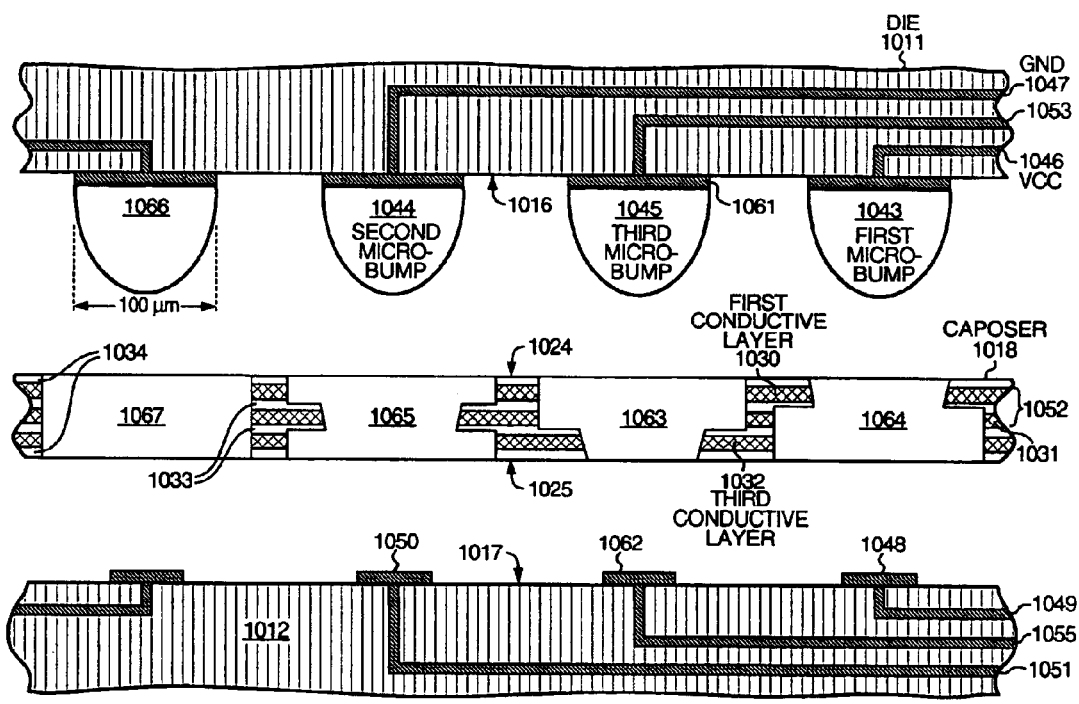
FIG. 16 is an expanded cross-sectional diagram of portions of a die, a ceramic package and another embodiment of a caposer.
Figure 17:
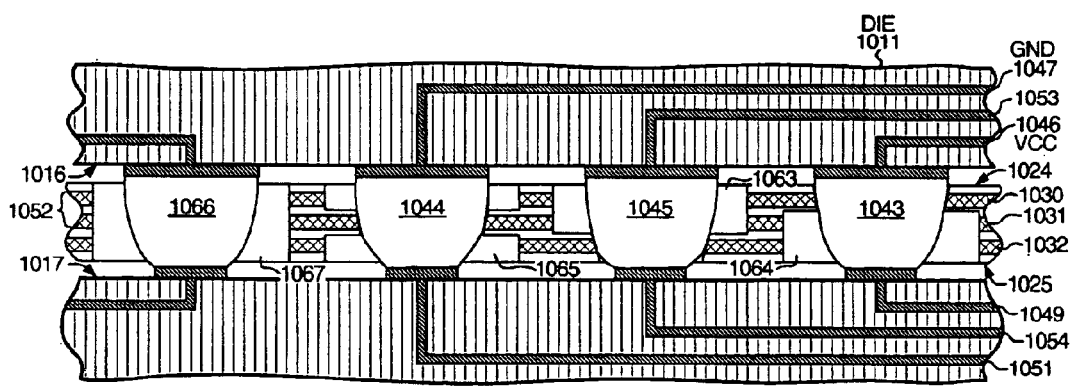
FIG. 17 shows the die, the ceramic package and the caposer of FIG. 16 after mounting.

FIGS. 16 and 17 show caposer 1018 with through-holes that have a different geometry than the through-holes shown in FIGS. 13 and 14. In the embodiment shown in FIGS. 13 and 14, insulating material 1059 in keepout areas prevents electrical contact between third micro-bump 1045 and first and second conductive layers 1030 and 1031. In the embodiment shown in FIGS. 16 and 17, on the other hand, the diameter of a through-hole 1063 at the depths of first and second conductive layers 1030 and 1031 is substantially larger than third micro-bump 1045 such that no electrical contact is made. Insulating material is not used to insulate third micro-bump 1045 from first and second conductive layers 1030 and 1031 in this embodiment.

When the metal comprising third-micro bump 1045 is melted, the surface tension of the molten metal causes the metal to recede to the lateral edge of pad 1061 and the lateral edge of landing pad 1062. Through holes 1064 and 1065 are also shown. These through holes result in selective electrical contact of the first and second micro-bumps 1043 and 1044 with the three conductive layers 130, 131 and 132 of the caposer.

FIG. 17 also shows a micro-bump 1066 extending through a through-hole 1067. Through-hole 1067 is cylindrical with a diameter sufficiently large such that micro-bump 1066 does not contact any of the conductive layers of caposer 1018. Another way to pass a micro-bump through caposer 1018 without it making contact with any conductive layer is to form conductive layers containing multiple large-diameter holes, e.g., thousands, that permit micro-bumps, to pass through caposer 1018 without making electrical contact with the conductive layers. For additional information on structures of planar bypass capacitors that permit vias to pass through conductive layers without making electrical contact, see U.S. patent application Ser. No. 10/377,863, by Trimberger et al., filed Feb. 28, 2003 (the entirety of which is hereby incorporated by reference).

Figure 18:
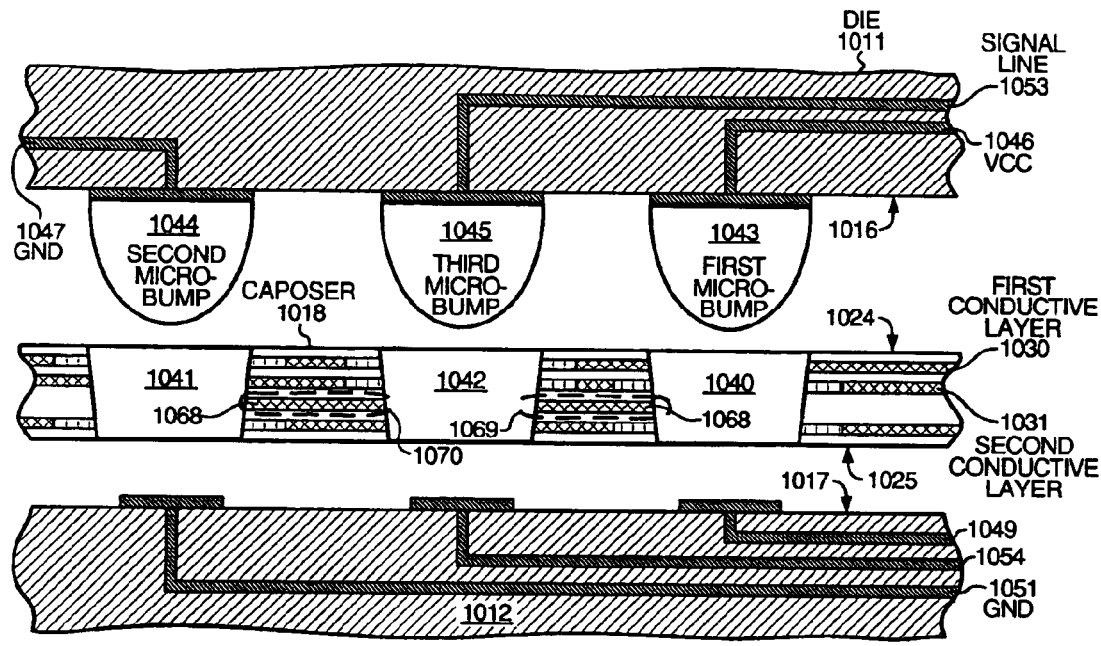
FIG. 18 is an expanded cross-sectional diagram of portions of a die, a ceramic package and an embodiment of a caposer that accomplished impedance matching with a DC load.

FIG. 18 is an expanded cross-sectional diagram of yet another embodiment. In this embodiment, caposer 1018 is used to match the characteristic impedance of a transmission line such as a trace on a printed circuit board. A partial layer 1068 of resistive material contacts the edges of through-holes 1040, 1041 and 1042. Partial layer 1068 is not a solid layer with holes, but rather is a layer of resistive traces. These resistive traces extend between selected through-holes of caposer 1018.

Figure 19:
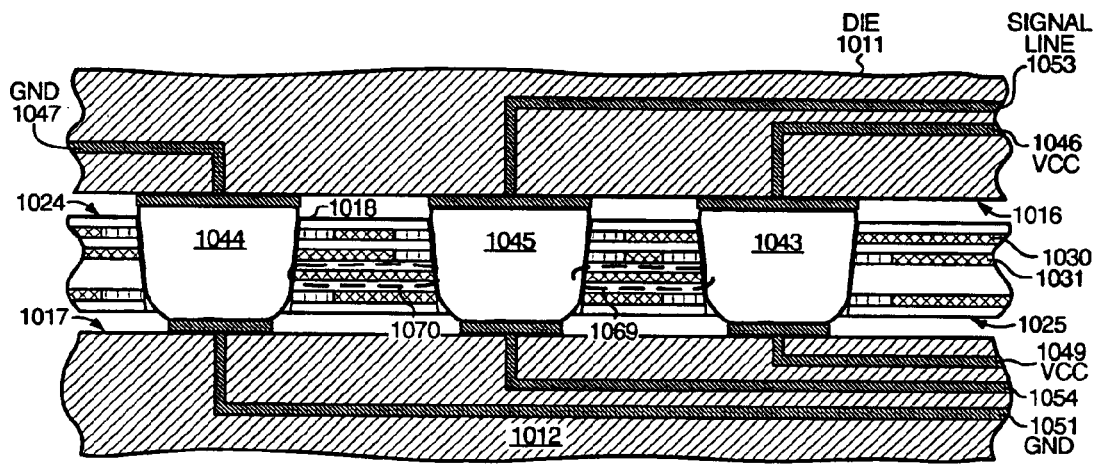
FIG. 19 shows the die, the ceramic package and the caposer FIG. 18 after stacking.

FIG. 19 shows the embodiment of FIG. 18 after caposer 1018 has been sandwiched between die 1011 and package 1012. Partial layer 1068 forms an electrically resistive path between third micro-bump 1045 and first micro-bump 1043, as well as between third micro-bump 1045 and second micro-bump 1044. The effect of the electrically resistive paths composed of resistive material is to create a resistor 1069 between third micro-bump 1045 and first micro-bump 1043 and a resistor 1070 between third micro-bump 1045 and second micro-bump 1044.

Figure 20:
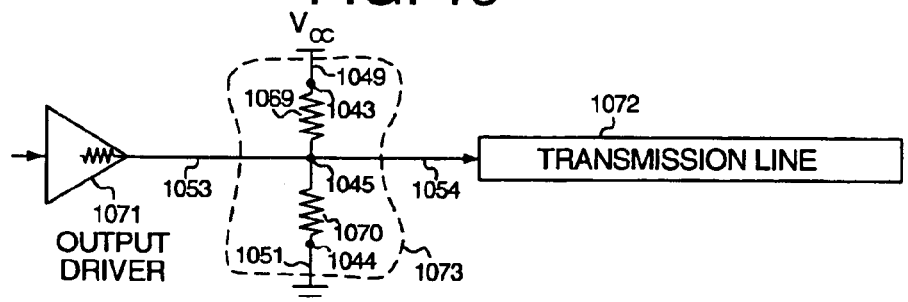
FIG. 20 is a simplified circuit diagram of the structure of FIG. 19.

FIG. 20 is a simplified circuit diagram representing the impedance-matching circuit formed in part by the embodiment shown in FIGS. 18 and 19. An active circuit on die 1011 contains an output driver 1071 that transmits a signal onto signal line 1053, through third micro-bump 1045, through signal conductor 1054 of ceramic package 1012 and onto a transmission line 1072 of a printed circuit board. Transmission line 1072 can be a trace on a printed circuit board, for example. Output driver 1071 exhibits an output impedance. Resistor 1069 couples third micro-bump 1045 to VCC through package power line 1049. Resistor 1070 couples third micro-bump 1045 to ground through package ground line 1051. Resistor 1069 and resistor 1070 together form a DC load structure 1073 that introduces an impedance. The signal path from output driver 1071 to transmission line 1072 exhibits an intervening impedance, which includes the impedance of DC load structure 1073. The trace constituting transmission line 1072 is longer than the signal path from output driver 1071 to transmission line 1072 and exhibits a characteristic impedance. The resistivity of the material comprising partial layer 1068 (see FIG. 18) is chosen so that the sum of the output impedance and the intervening impedance substantially equals the characteristic impedance of transmission line 1072.

By matching the impedance of the signal path up to the trace to the characteristic impedance of the relatively longer trace, signal reflection at the interface of the signal path and the trace on the printed circuit board is reduced. A signal that follows the signal path from output driver 1071 to transmission line 1072 is reflected at the interface with the trace where the rise time of the signal is shorter than the propagation time of the signal over the entire length of the trace on the printed circuit board. Setting the impedance of the signal path using DC load structure 1073 is useful in reducing signal reflection, especially in higher frequency signals, e.g., hundreds of MHz. Materials having various resistivities can be used to make partial layer 1068, such as carbon-filled epoxy, a, ceramic material, an organic material, or a non-ceramic inorganic material.

Figure 21:
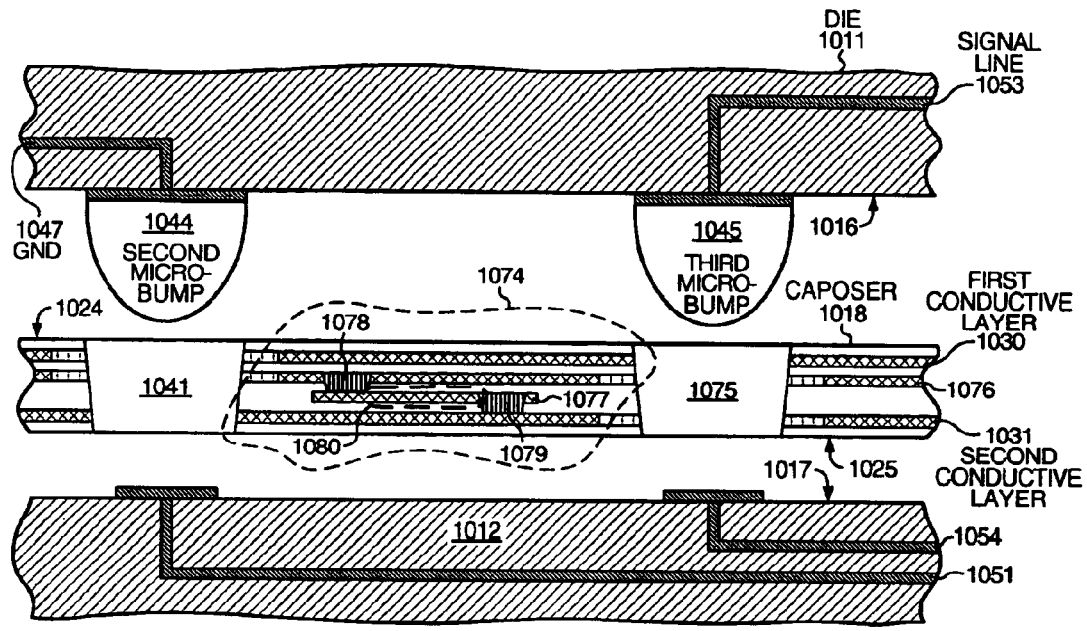
FIG. 21 is an expanded cross-sectional diagram of portions of a die, a ceramic package and an embodiment of a caposer that accomplishes impedance matching with a AC load.

FIG. 21 is an expanded cross-sectional diagram of caposer 1018 illustrating another embodiment used to match the characteristic impedance of a trace on a printed circuit board. FIG. 21 shows caposer 1018 with an AC load structure 1074 used to match the characteristic impedance of a transmission line such as a trace on a printed circuit board. Third micro-bump 1045 is coupled to signal line 1053 and has a corresponding through-hole 1075 whose edges expose only first conductive layer 1030.

In this embodiment, caposer 1018 has an additional conductive layer 1076 between first conductive layer 1030 and second conductive layer 1031. Additional conductive layer 1076 forms a plate of a capacitor 1052 of the AC load structure 1074. In addition, caposer 1018 contains a partial layer 1077 of resistive material that does not contact the edges of any through-holes. One end of a resistive strip of partial layer 1077 is coupled to conductive layer 1076 by a first blind via 1078. A second end of the resistive strip of partial layer 1077 is coupled to second conductive layer 1031 by a second blind via 1079. The resistive strip of partial layer 1077 constitutes a resistor 1080 that extends from first blind via 1078 to second blind via 1079. Resistor 1080 is a resistor of the AC load structure 1074.

Figure 22:
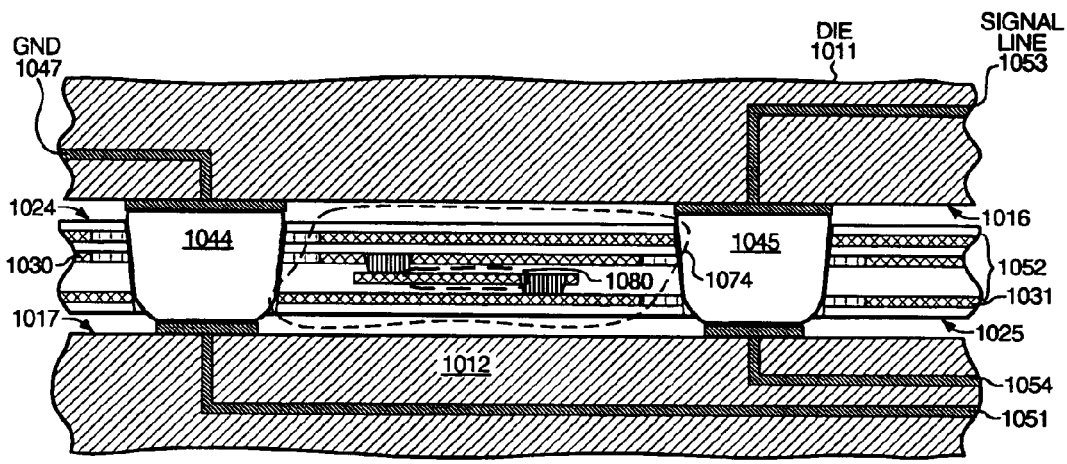
FIG. 22 shows the die, the ceramic package and the caposer FIG. 21 after stacking.

FIG. 22 shows the example of caposer 1018 of FIG. 21 after caposer 1018 has been sandwiched between die 1011 and package 1012. A signal traveling through signal line 1053, third micro-bump 1045 and signal conductor 1054 of ceramic package 1012 experiences an intervening impedance due in part to an impedance from AC load structure 1074.

Figure 23:
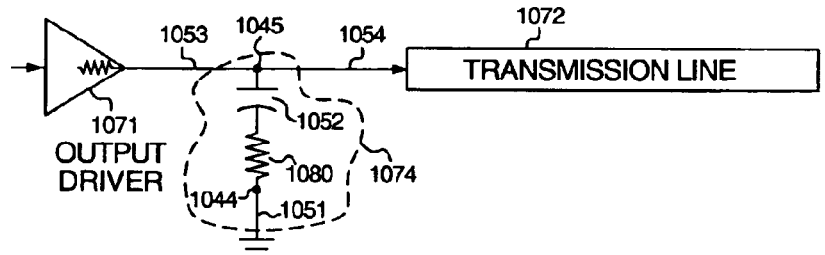
FIG. 23 is a simplified circuit diagram of the structure of FIG. 22.

FIG. 23 is a simplified circuit diagram representing the impedance-matching circuit formed in part by caposer 1018 and AC load structure 1074 of FIG. 22. An active circuit on die 1011 contains an output driver 1071 that transmits a signal onto signal line 1053, through third micro-bump 1045, through signal conductor 1054 of ceramic package 1012 and onto a transmission line 1072, for example, a trace on a printed circuit board.

Output driver 1071 exhibits an output impedance. AC load structure 1074 couples third micro-bump 1045 to AC ground through package ground line 1051. Capacitor 1052 and resistor 1080 together form AC load structure 1074 that produces an impedance. The signal path from output driver 1071 to transmission line 1072 exhibits the intervening impedance, which includes the impedance from AC load structure 1074. The resistance of resistor 1080 and the capacitance of capacitor 1052 are selected so that the sum of the output impedance and the intervening impedance substantially equals the characteristic impedance of transmission line 1072. Materials having various resistivities can be used to make partial layer 1077. By matching the impedance of the signal path up to the trace to the characteristic impedance of the trace, signal reflection at the interface of the signal path and the trace is reduced.

Figure 24:
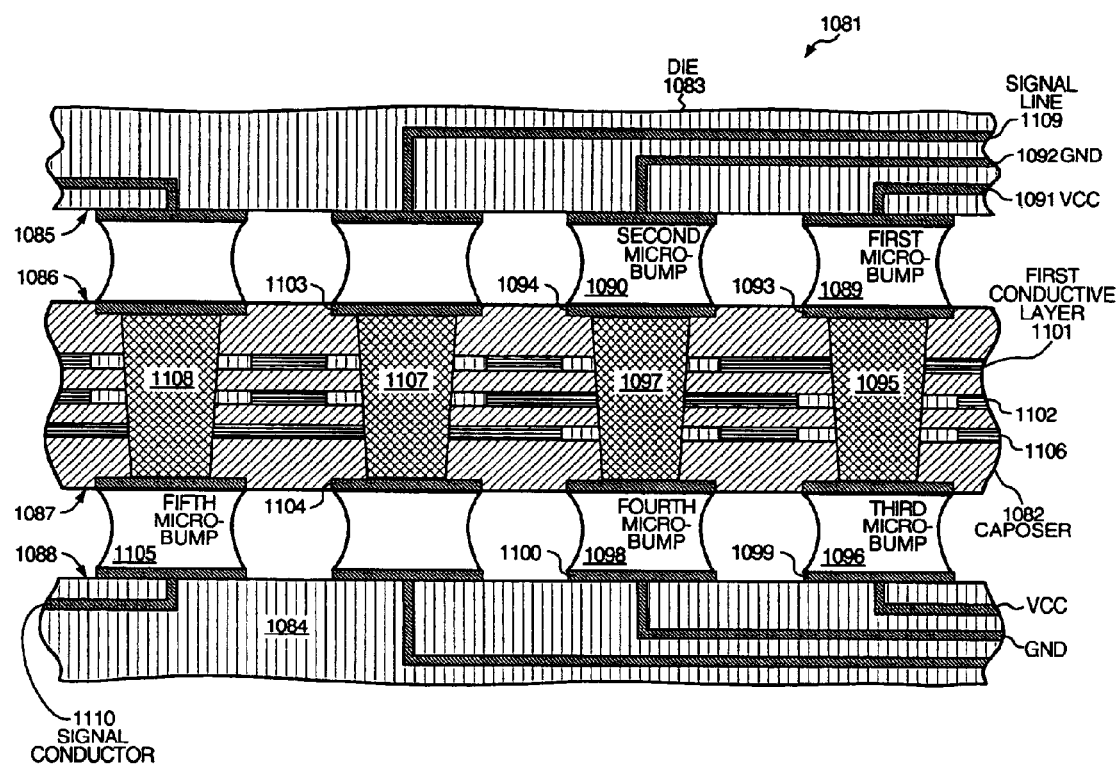
FIG. 24 is a cross-sectional diagram of a die, a ceramic package and another embodiment of a caposer after stacking.

FIG. 24 is a simplified cross sectional diagram of a structure 1081 involving a via caposer 1082. Via caposer 1082 is disposed inside an integrated circuit package 1084 between a die 1083 and an inside upper surface 1088 of the package 1084. Micro-bumps are present in an array on a substantially planar surface 1085 on the face side of die 1083. Die 1083 is mounted face side down on a first surface 1086 of via caposer 1082 in a flip-chip manner. Each micro-bump in the array on die 1083 contacts a landing pad in a corresponding array of landing pads on first surface 1086 of via caposer 1082. The upper surface of the landing pads on first surface 1086 is flush with first surface 1086.

Via caposer 1082 is a multi-layered parallel-layer capacitive device. Via caposer 1082 has vias and a thin, wafer-like, planar form, with a second surface 1087 opposite first surface 1086. Via caposer 1082 can be much thicker, however, than the through-hole caposer 1018 described above. An array of micro-bumps is present on second surface 1087 of via caposer 1082. Each micro-bump extends from a corresponding pad on second surface 1087. The lower surface of the pads on second surface 1087 is flush with second surface 1087.

Each micro-bump in the array on second surface 1087 of caposer 1082 contacts a landing pad in a corresponding array of landing pads on the upper inside surface 1088 of package 1084. Thus, caposer 1082 is disposed between upper surface 1088 of ceramic package 1084 and planar surface 1085 of die 1083.

The array of micro-bumps on die 1083 includes a first micro-bump 1089 and a second micro-bump 1090. First micro-bump 1089 is coupled to a power supply line (VCC) 1091 within die 1083, whereas second micro-bump 1090 is coupled to a ground line 1092 within die 1083. First micro-bump 1089 contacts a first landing pad 1093 on first surface 1086 of caposer 1082. Second micro-bump 1090 contacts a second landing pad 1094 on first surface 1086. First landing pad 1093 on first surface 1086 is coupled through a via 1095 to a third micro-bump 1096 on a pad on second surface 1087 of caposer 1082. Second landing pad 1094 on first surface 1086 is coupled through a via 1097 to a fourth micro-bump 1098 on a pad on second surface 1087 of caposer 1082. Third micro-bump 1096 and fourth micro-bump 1098 are in turn coupled to a third landing pad 1099 and a fourth landing pad 1100, respectively, on upper surface 1088 of ceramic package 1084. Vias 1095 and 1097 are made of a conductive material, such as metal. Via 1095 makes contact with a first conductive layer 1101 of caposer 1082. First conductive layer 1101 is thereby coupled to the power supply line 1091. Via 1097 makes contact with a second conductive layer 1102. Second conductive layer 1102 is thereby coupled to the ground line 1092. First conductive layer 1101 and second conductive layer 1102 together constitute a bypass capacitor.

Die 1083 includes an active circuit. During operation of the active circuit, the active circuit draws a supply current. A spike of supply current passes up from package 1084, through via 1095, through VCC supply line 1091, through the active circuit, through GND supply line 1109, through via 1097, and back to package 1084. Because some resistance and inductance is inherently associated with this signal path, the voltage supplied to the active circuit drops as the spike of supply current is drawn. In accordance with an embodiment of the present invention, however, the bypass capacitor of caposer 1082 (formed by conductive layers 1101 and 1102) supplies some of the spike of supply current drawn by the active circuit in die 1083. This current supplied by caposer 1082 reduces the drop in supply voltage on the die 1083. By placing the caposer 1083 immediately adjacent die 1083 within integrated circuit package 1084, the structure 1081 avoids the use of long-distance interconnect to connect an active circuit in the interior of die 1083 to a decoupling capacitor.

In addition to illustrating a via caposer having a bypass capacitor, FIG. 24 illustrates a via caposer that redistributes signals. FIG. 24 shows a fifth landing pad 1103 on first surface 1086 of caposer 1082, a fifth micro-bump 1105 on a pad on second surface 1087 of caposer 1082, and a third conductive layer 1106 within caposer 1082. Fifth landing pad 1103 is coupled to third conductive layer 1106 by a via 1107. Via 1107 is also coupled to a pad 1104 on second surface 1087. A via 1108 couples third conductive layer 1106 to fifth micro-bump 1105 through the pad on second surface 1087. Third conductive layer 1106 comprises a conductive trace that provides a portion of a conductive path between fifth landing pad 1103 and fifth micro-bump 1105.

Fifth landing pad 1103 is coupled to a signal line 1109. By providing an electrically conductive path between fifth landing pad 1103 and fifth micro-bump 1105 that extends at least some distance parallel to first surface 1086, structure 1081 is able to couple a micro-bump at any position in the array of micro-bumps on planar surface 1085 with a landing pad at a different position in the array of landing pads on upper surface 1088 of ceramic package 1084. Thus, caposer 1082 can be used to redistribute signal inputs and outputs from array positions on die 1083 to different positions on ceramic package 1084.

The re-routing performed by caposer 1082 can be accomplished during assembly of structure 1081, without modifying integrated circuit die 1083. Integrated circuit die 1083 may, for example, be an application specific integrated circuit (ASIC), the input/output terminals of which have fixed functionalities. If an error is made in the layout of either the ASIC or the printed circuit board to which the ASIC package is to be attached such that a proper connection is not made between an input/output terminal on the ASIC and a particular trace on the printed circuit board, then caposer 1082 can be used to re-route the connection and fix the problem. Using caposer 1082 to re-route the connection can be less costly than refabricating the printed circuit board to fix the problem or refabricating the ASIC die 1083 to fix the problem.

Via caposer 1082 can be made using relatively inexpensive printed circuit board technology as opposed to the more expensive semiconductor processing technology used to integrated circuits. Re-routing connections using caposer 1082 can therefore be,cost effective for a relatively small number of packaged dies.

As illustrated in FIG. 24, a via caposer 1082 can be made that couples a micro-bump on planar surface 1085 of die 1083 to a landing pad on upper surface 1088 of package 1084 that does not lie laterally below die 1083. Thus caposer 1082 can be used to mount dice onto ceramic packages where the dice are laterally offset from the arrays of landing pads on the ceramic packages. Multiple dice that are arranged in an array as tiles over the upper surface 1088 of ceramic package 1084 can be connected by a single caposer to a single array of landing pads on upper surface 1088, even where the array of landing pads has a significantly smaller footprint that the total footprint area of the multiple dice.

FIG. 24 also illustrates an embodiment of a via caposer that provides series termination to match a characteristic impedance of a signal path. In addition to redistributing connections between micro-bumps on a die and landing pads on a package, the structure 1081 of FIG. 24 also controls the impedance of the electrically conductive path between fifth landing pad 1103 and fifth micro-bump 1105 so as to match the impedance of a signal path from an output driver to a trace on a printed circuit board to the characteristic impedance of the trace. The signal flows through the electrically conductive path. The signal flows from an output driver on die 1083, through signal line 1109, through fifth landing pad 1103, through via 1107, through third conductive layer 1106, through via 1108, through fifth micro-bump 1105, and through a conductor 1110 of ceramic package 1012. The impedance of the electrically conductive path between landing pad 1103 and micro-bump 1105 can be controlled by adjusting the resistivity of the materials composing third conductive layer 1106, via 1107 and via 1108.

The output driver exhibits an output impedance. The signal path between the output driver and the trace being driven exhibits an intervening impedance. The intervening impedance includes the impedance of the electrically conductive path. In one embodiment, the resistance of the path between vias 1107 and 1108 is chosen so that the sum of the output impedance and the intervening impedance substantially equals the characteristic impedance of the trace on the printed circuit board.

FIGS. 25A through 25J show a cross section of a portion of via caposer 1082 of FIG. 24 showing some steps in forming via 1107. In this embodiment, caposer 1082 is formed on a dissolvable substrate using ordinary photolithographic semiconductor processing technology. The dissolvable substrate may, for example, be a polyimide substrate. Initially, a metal layer is deposited on the dissolvable substrate and is patterned to form pad 1104. An insulative layer is then deposited over pad 1104, and third conductive layer 1106 of metal is deposited, a subsequent insulative layer is formed over conductive layer 1106, and conductive layer 1102 of metal is formed over that. The resulting structure is shown in cross-section in FIG. 25A.

Next, conductive layer 1102 is patterned to form a disc-shaped keepout area. The resulting structure is shown in cross-section in FIG. 25B. Insulative material is deposited and the surface is planarized such that a disc of the insulative material remains in the keepout area. The resulting structure is shown in cross-section in FIG. 25C.

Figure 25A:
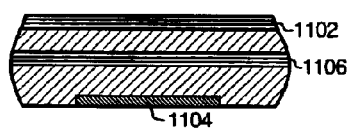
FIGS. 25A through 25J are simplified cross-sectional diagrams of the caposer of FIG. 24 showing steps in forming a via through the caposer.
Figure 25B:
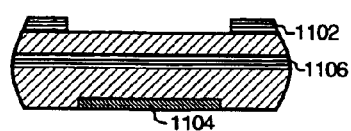
Figure 25C:
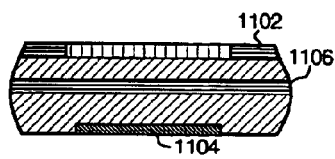
Figure 25D:
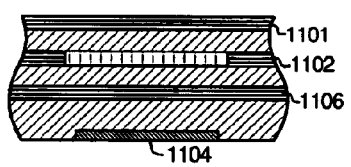
Figure 25E:
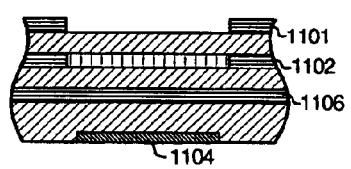
Figure 25F:
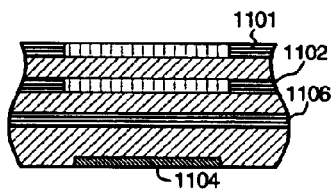
Figure 25G:
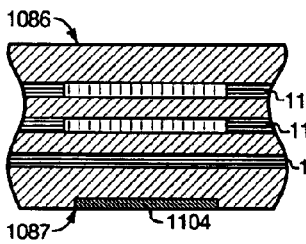
Figure 25H:
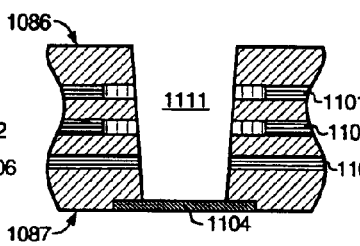
Figure 25I:
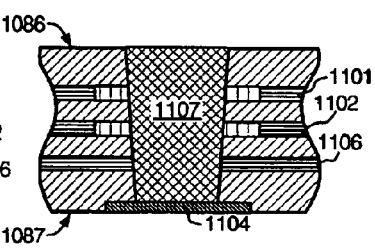
Figure 25J:
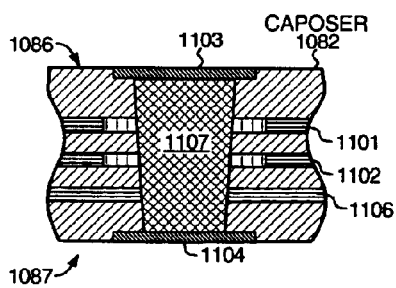

Next, an insulative layer is deposited and then the first conductive layer 1101 of metal is deposited. The resulting structure is shown in cross-section in FIG. 25D. In similar fashion to the way that a disc of insulative material was formed in the keepout area in layer 1102, a disc of insulative material is formed in the keepout area in layer 1101. FIG. 25E is a cross-sectional view of the patterned keepout area, and FIG. 25F is a cross-sectional view of the disc of insulating material disposed in the keepout area. An insulative layer is then formed over the composite structure. The resulting structure is shown in FIG. 25G.

A hole 1111 is then cut down through the structure using, for example, reactive ion etching until pad 1104 is reached. Ring shaped structures of insulative material separate hole 1111 from the conductive material in layers 1101 and 1102. Hole 1111, however, cuts down through conductive layer 1106 so that the material of conductive layer 1106 forms a part of the inside annular surface of hole 1111. The resulting structure is shown in cross-section in FIG. 25H.

Next, metal is sputtered onto the structure to fill hole 1111. The structure is planarized thereby leaving a conductive via 1107 disposed in hole 1111. The resulting structure is shown in cross-section in FIG. 25I.

A recess for landing pad 1103 is then cut into the upper surface of caposer, metal is deposited over the upper surface to fill the recess, and the composite structure is planarized to remove all metal not in a recess. The resulting structure is shown in cross-section in FIG. 25J. In some embodiments, a solder mask layer is formed over the upper surface of the structure such that only the upper surfaces of metal landing pads are not covered by solder masks. Deep trenches can be etched between the various rectangular caposers on the substrate wafer to separate the caposers, one from another.

Once the caposers have been formed on the dissolving substrate and separated one from the other by the deep trenches, the entire structure is placed in a bath of dissolving solution. The substrate dissolves thereby releasing the various caposers. The caposers are retrieved from the bath and dried.

Alternatively, caposer 1082 is a thin multilayer printed circuit board that is disposed inside integrated circuit package 1082. Small geometry printed circuit board fabrication processes are used. The insulative layers are epoxy/fiberglass layers. The vias are metal plugs. Resistive traces within the caposer can be traces of a resistive carbon material. In the case that caposer 1082 is made using printed circuit board techniques, caposer 1082 may have a cross-sectional structure more representative of a printed circuit board structure than the structure illustrated in FIGS. 25A–25J. Bond balls of solder are formed on the bottom surface of caposer 1082 using known processes. After a large board of caposers is formed, the board is cut into individual caposers in the same way that a number of small printed circuit boards is made from a large board.

In accordance with another embodiment, a through-hole interposer is fabricated with solder filling the through-holes. Pre-filling the through holes with solder has several benefits. For example, the thickness of the interposer is not limited by the radius of the micro-bumps on the integrated circuit die. In one of the embodiments of a through-hole caposer described above, solder from micro-bumps on a die protrudes through the through holes to make contact with landing pads on the inside surface of an integrated circuit package. Where the radius of a semi-spherical micro-bump is smaller than the thickness of the through-hole caposer, there may not be enough solder material in the micro-bump to fill the through hole when the solder has melted. For example, a semi-spherical micro-bump with a diameter of 100 microns does not completely fill a cylindrical through hole with a diameter of 100 microns that extends through a 50-micron-thick interposer.

Figure 26:
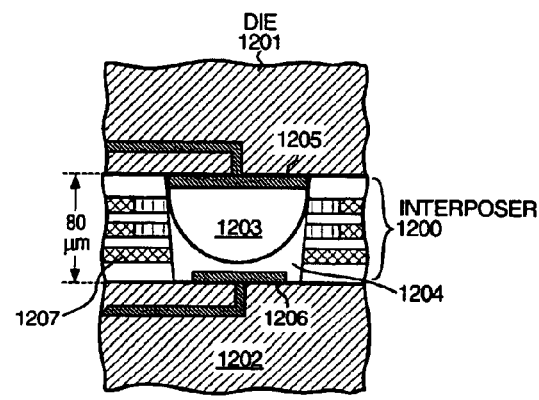
FIG. 26 is a cross-sectional view of a micro-bump extending into the hole of a through-hole interposer.

FIG. 26 shows an interposer 1200 sandwiched between a flip-chip die 1201 and an integrated circuit package 1202. A micro-bump 1203 extends into through hole 1204. Through-hole 1204 extends through the entire 80-micron thickness of interposer 1200. Micro-bump 1203 has a semi-spherical shape with a radius of about fifty microns. When the solder in micro-bump 1203 melts, solder contacts both land 1205 on the face side of flip-chip die 1201 and a landing pad 1206 on the upper surface of integrated circuit package 1202. There is not enough solder, however, to fill through hole 1204 entirely, and undesirable air pockets and voids may therefore be left in through hole 1204. Moreover, the solder may not contact conductive layer 1207 as desired. Where a thicker interposer than interposer 1200 is employed, the solder material in micro-bump 1203 may not even be sufficient to contact landing pad 1206.

Pre-filling the through-holes with solder not only permits thicker through-hole interposers and caposers to be employed, but it also obviates the need to fabricate micro-bumps on the flip-chip die. The volume of solder that fills a through-hole in a solder-filled through-hole interposer exceeds the volume of the through hole and protrudes upward from the upper surface of the interposer and also protrudes downward from the bottom surface of the interposer. The solder-filled through holes line up with lands on the face side of the flip-chip die, as well as with landing pads on the inside surface of an integrated circuit package. The solder-filled through-hole interposer aligns the flip-chip die to the package without the need for micro-bumps on the flip-chip die as the molten solder is attracts to metal lands and landing pads. In effect, the solder-filled through-hole interposer has built-in solder balls.

Figure 27:
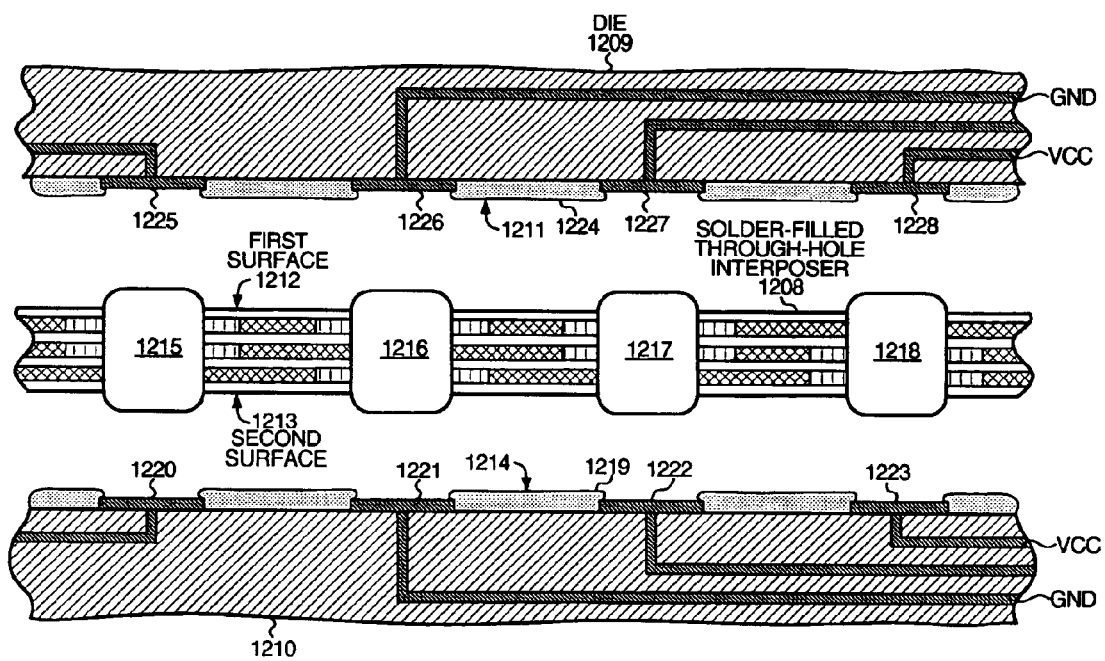
FIG. 27 is a cross-sectional exploded view of a solder-filled through-hole interposer between a flip-chip die and an integrated circuit package.

FIG. 27 shows a cross-sectional view of a solder-filled through-hole interposer 1208 assembled between a die 1209 of an integrated circuit package 1210. FIG. 27 shows interposer 1208 before the face side 1211 of die 1209 is stacked on a first surface 1212 of interposer 1208, and before a second surface 1213 of interposer 1208 is stacked on an inside surface 1214 of package 1210. No micro-bumps are provided on face side 1211 of die 1209. Solder plugs 1215–1218 fill through holes in interposer 1208. Each of solder plugs 1215–1218 contains a greater volume of solder than the volume of its corresponding through hole. Minimal or no air voids, therefore, remain between the solder and the through holes in the final soldered assembly, even after some solder is attracted to metal lands on die 1209 and metal landing pads on package 1210.

Inside surface 1214 of package 1210 has a solder mask layer 1219 that extends up past landing pads 1220–1223 so as to form self-aligning indentations to receive solder from interposer 1208. The face side of die 1209 also has an insulating layer 1224 that acts as a solder mask. Self-aligning indentations in layer 1224 above lands 1225–1228 receive solder from interposer 1208. After stacking and heating, solder from solder plugs 1215–1218 is attracted to metal lands 1225–1228 on die 1209 and to metal landing pads 1220–1223 on package 1210, respectively. Thus, interposer 1208 self aligns to package 1210, as well as to die 1209. In the final soldered assembly, minimal or no air voids remain between interposer 1208 and package 1210 or between die 1209 and interposer 1208. After soldering, a filler material can be injected between interposer 1208 and die 1209 and between interposer 1208 and package 1210 to fill any small remaining voids. The filler material can be the same filler material used in flip-chip packaging.

Figure 28A:
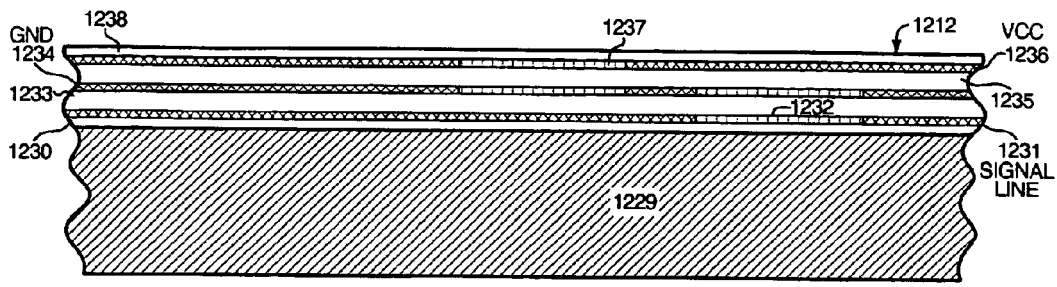
FIGS. 28A through 28D are simplified cross-sectional diagrams showing steps in forming the solder-filled through-hole interposer of FIG. 27.

FIGS. 28A–28D illustrate steps in a method of making solder-filled through-hole interposer 1208. Layers are formed on a support substrate 1229, as shown in FIG. 28A. The layers are formed using semiconductor wafer manufacturing photolithography and etching processes. Support substrate 1229 is made of an evanescent material that can be dissolved or liquefied at a low temperature without dissolving or liquefying the interposer, which is made of silicon dioxide and metal. A polyimide wafer is an example of a support substrate made of evanescent material.

A plurality of rectangular interposers is formed on support substrate 1229. First, a layer 1230 of oxide is deposited.

Then a conductive layer 1231 of metal is sputtered onto oxide layer 1230. Conductive layer 1231 is patterned and etched, and keepout areas are formed, including keepout area 1232. A second oxide layer 1233 is deposited over conductive layer 1231, and a second layer 1234 of metal is sputtered over second oxide layer 1233. Second layer 1234 is patterned and etched, and keepout areas are formed. A third oxide layer 1235 is deposited over second metal layer 1234. A third layer 1236 of metal is sputtered over third oxide layer 1235, and third metal layer 1236 is patterned and etched appropriately. Keepout areas are formed in third metal layer 1236, including keepout area 1237. Finally, a top oxide layer 1238 is deposited over third metal layer 1236. The upper surface of oxide layer 1238 becomes first surface 1212 of interposer 1208. In this way, an interposer structure of interleaved insulating and conductive layers is fabricated on support substrate 1229. In this embodiment, each of layers 1231, 1234 and 1236 is one micron thick. Although interposer 1208 described here includes three conductive layers, this is but an illustrative example and it is understood that an interposer can have more or fewer conductive layers.

In this embodiment, conductive layer 1231 is used as a signal line to conduct signals, second metal layer 1234 is used as a ground plate, and third metal layer 1236 is used as a power plate. Thus, layer 1234 and layer 1236 together constitute the plates of a capacitor. Interposer 1208 can function as a bypass capacitor and can redistribute signals. Depending on the resistivity of conductive layer 1231, interposer 1208 can also match the characteristic impedance of a transmission line such as a trace on a printed circuit board.

Figure 28B:
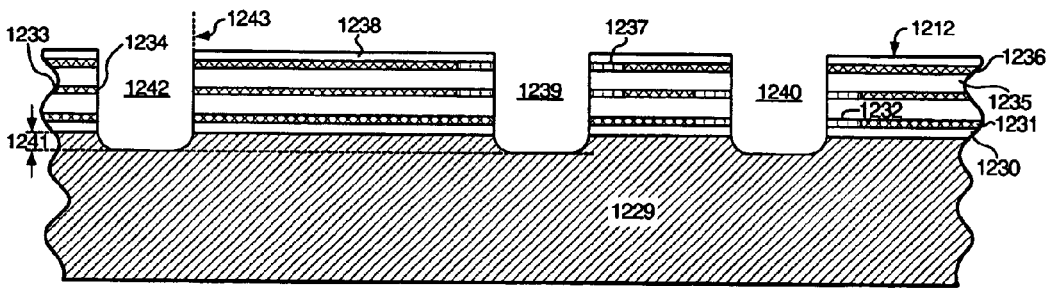

FIG. 28B shows how through holes 1239 and 1240 are etched through the interposer structure such that through holes 1239 and 1240 do not cut through and contact conductive layers containing appropriately placed keepout areas. For example, through hole 1239 cuts through keepout area 1237 and does not contact third layer 1236, and through hole 1240 cuts through keepout area 1232 and does not contact conductive layer 1231. At locations where keepout areas are absent, the through holes contact (i.e., cut through) conductive layers. For example, through hole 1239 contacts conductive layer 1231, and through hole 1240 contacts third layer 1236. Through holes 1239 and 1240 are etched completely through the interposer structure and into support substrate 1229 by a distance 1241. A rectangular trench, such as trench 1242, is cut all the way around each of the plurality of interposer on support substrate 1229. Trench 1242 is rectangular when viewed from the top-down perspective. An edge 1243 of trench 1242 forms the peripheral boundary of the interposer structure containing through holes 1239 and 1240.

Figure 28C:
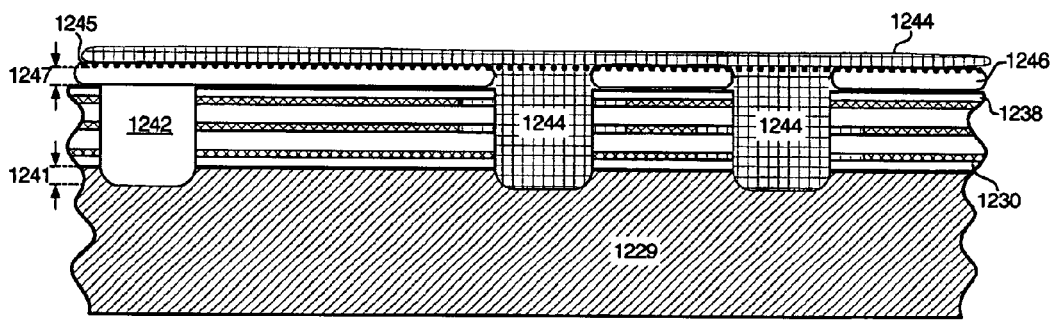

FIG. 28C illustrates later steps in which solder paste 1244 is silk-screened onto the interposer structure such that solder paste fills through holes 1239 and 1240 and does not fill trench 1242. The round dot-like structures 1245 aligned horizontally above the interposer structure represent the mesh of a silk screen. A pattern of paint is formed on the silk screen to block material from going through the mesh at painted areas of the pattern. Paint 1246 of a predetermined thickness is applied to the silk-screen mesh such that the mesh is supported above the interposer structure at a distance 1247. The silk-screen mesh is aligned over the interposer structure, and solder paste is pressed through the silk screen such that solder paste fills the exposed through holes. Solder fills through holes 1239 and 1240 and extends below oxide layer 1230 by distance 1241.

When the silk-screen is removed, a mesa-like shape of solder paste remains above each through hole. The top of the mesa-like shape is determined by the distance 1247 between the upper surface of the interposer and the plane of the mesh of the silk-screen. When the silk-screening process is complete, solder paste 1244 extends up past the upper surface of oxide layer 1238 in the areas above through holes 1239 and 1240. The solder paste is then allowed to dry so that it no longer flows.

Next, the entire interposer structure and support substrate 1229 are placed in a bath of dissolving solution such as polyimide solvent. The evanescent material comprising support substrate 1229 dissolves away entirely, leaving a plurality of individual rectangular interposers at the bottom of the bath. The through holes in the interposers are filled with hardened solder paste. Rather than dissolving away the support substrate 1229, ashing, plasma etching and/or chemical mechanical polishing (CMP) could be used to remove the support substrate 1229.

Figure 28D:
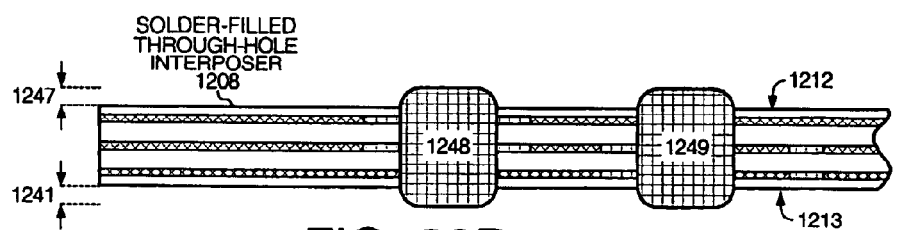

FIG. 28D shows interposer 1208 after the support substrate 1229 has been removed by the dissolving bath. Hardened solder plugs 1248 and 1249 extend both above first surface 1212 and below second surface 1213 of interposer 1208. In this embodiment, interposer 1208 is approximately 80 microns thick. Distance 1241 and distance 1247 are each about 10 microns. Interposer 1208 is removed from the bath, and dried. Interposer 1208 can be picked up with a vacuum wand and placed on the face side 1211 of flip-chip die 1209. Flip-chip die 1209, together with interposer 1208, is then placed face side down onto the landing pads on the inside surface 1214 of package 1210. The entire assembly is then placed in an oven to melt the solder. As the solder melts and contacts metal lands on die 1209 and metal landing pads on package 1210, interposer 1208 self aligns to package 1210 and to die 1209.

Although a technique is set forth here where an entire support substrate is dissolved away to release the interposer, this technique need not be employed. In one embodiment, a layer of dissolving material is formed on a non-dissolving substrate. The interposer is then built on the layer of dissolving material. After the interposer is fabricated, the dissolving material is dissolved away, thereby freeing the interposer from the support substrate. In another embodiment, the interposer is built on a layer of material that melts at a temperature below the melting points of the constituent materials of the interposer. Once the interposer is formed on the support substrate, the structure, is heated to melt the layer of material on which the interposer was built, thereby freeing the interposer from the support substrate. The silk-screen mesh described above need not be made of silk, but rather can be made of any suitable mesh material used in silk-screen printing processing. Similarly, the material used to block solder paste from passing through certain areas of the silk-screen need not be paint. Rather, other blocking materials used in silk-screen processing can be used. Although one technique for making an interposer with built-in solder plugs using a silk-screen process is described above, the interposer structure can be made by other suitable methods including processing steps typically used in fabricating integrated circuits.

Although the present invention is described in connection with certain specific embodiments for instructional purposes, the present invention is not limited thereto. Although in one embodiment, micro-bumps on a die pass through caposer through-holes to contact landing pads on an inside surface of an IC package, in other embodiments, solder balls on the IC package pass through caposer through-holes to contact landing pads on the upper surface of a printed circuit board. Although contact with a via is made in the caposer of FIG. 24 through a separate landing pad structure, a landing pad need not be a separate structure. For example, the landing pad on a caposer can be a portion of a via. Although some embodiments described above are used to redistribute signal inputs and outputs from array positions on a die to different positions on a ceramic package, other embodiments re-route signals from array positions on one die to different positions on another die. In these other embodiments, the caposer is stacked between the two dice. In some embodiments, caposers have bypass capacitors with more than two parallel plates. In some embodiments, a caposer includes multiple bypass capacitors. For example, one bypass capacitor may bypass a lower internal logic supply voltage whereas a second bypass capacitor may bypass a larger voltage used by the I/O circuitry of the die. Although a caposer is described above that includes a bypass capacitor, this need not be the case. In one embodiment, a caposer has only a single conductive layer and is used to redistribute signals between an array of micro-bumps on a die and an array of landing pads on a package. The caposer in this embodiment does not function as a bypass capacitor and does not have two capacitor plates. Although the invention is described in connection with solving problems caused by drawing current spikes from a power supply line, the invention applies equally to solving ground bounce problems caused by dumping surges of current onto a ground line. A caposer can be used to impedance match to a transmission line to an output driver. A caposer can also be used to impedance match an input receiver to a transmission line. Accordingly, various modifications, adaptations, and combinations of various features of the described embodiments can be practiced without departing from the scope of the invention as set forth in the following claims.

What is claimed is:

1. An assembly, comprising:
   an integrated circuit die having a substantially planar surface, a power supply conductor, a ground conductor and a signal conductor;
   a package, the package housing the integrated circuit die and having an inside upper surface and a landing pad; and
   a caposer having a first surface, a first conductive layer, a second conductive layer, and a second surface, wherein the first conductive layer and the second conductive layer are substantially planar and are parallel to one another, the first conductive layer being coupled to the power supply conductor, the second conductive layer being coupled to the ground conductor, the caposer having a through-hole that extends from the first surface, through the first and second conductive layers and to the second surface, wherein the signal conductor of the integrated circuit die is coupled to the landing pad through the through-hole without being coupled to the first conductive layer or the second conductive layer, wherein the first surface of the caposer is disposed adjacent to the substantially planar surface of the integrated circuit die, and wherein the second surface of the caposer is disposed adjacent to the inside upper surface of the package.

2. The assembly of claim 1, wherein the caposer further comprises a dielectric layer, the dielectric layer being disposed between the first conductive layer and the second conductive layer, and wherein the first conductive layer, the dielectric layer and the second conductive layer together constitute a bypass capacitor.

3. The assembly of claim 1, wherein the integrated circuit die further comprises a micro-bump, the micro-bump being coupled to the signal conductor, and wherein the micro-bump extends through the through-hole and contacts the landing pad.

4. The assembly of claim 3, wherein the integrated circuit die further comprises a plurality of micro-bumps disposed in a pattern on the substantially planar surface, and wherein the caposer has a plurality of through-holes, the plurality of through-holes of the caposer being disposed in a pattern that substantially matches the pattern of micro-bumps on the substantially planar surface.

5. The assembly of claim 1, wherein the integrated circuit die further comprises a micro-bump, the micro-bump being coupled to the signal conductor, and wherein the caposer further comprises a conductive via disposed in the through-hole, and wherein the signal conductor of the integrated circuit die is coupled at least in part by the conductive via to the landing pad of the package.

6. The assembly of claim 5, wherein the integrated circuit die further comprises a plurality of micro-bumps disposed in a pattern on the substantially planar surface, and wherein the caposer further comprises a plurality of conductive vias disposed in a pattern, each conductive via of the plurality of conductive vias extending from the first surface of the caposer to the second surface of the caposer, and wherein the pattern of conductive vias of the caposer substantially matches the pattern of micro-bumps of the integrated circuit die.

7. The assembly of claim 1, wherein the caposer further comprises a solder plug, at least a part of the solder plug being disposed in the through-hole such that the solder plug extends from the first surface of the caposer to the second surface of the caposer.

8. The assembly of claim 7, wherein the through-hole has a volume, and wherein the solder plug includes a volume of solder that exceeds the volume of the through-hole.

9. The assembly of claim 7, wherein the solder plug extends beyond the first surface in a direction perpendicular to the first surface, and wherein the solder plug extends beyond the second surface in a second direction opposite the first direction.

10. The assembly of claim 1, wherein the caposer is less than 100 microns thick.

11. The assembly of claim 1, wherein the caposer includes no semiconductor material.

12. The assembly of claim 1, wherein the caposer includes no transistor and no PN junction.

13. The assembly of claim 1, wherein the caposer includes no, logic element.

14. A method, comprising:
   assembling a caposer, an integrated circuit die, and a package, wherein the integrated circuit die includes a signal conductor, and wherein the caposer includes a bypass capacitor and has a through-hole that extends through the caposer, the bypass capacitor having a first plate and a second plate, the signal conductor being coupled through the through-hole of the caposer to a landing pad on an inside upper surface of the package such that the signal conductor is not coupled to the first plate of the bypass capacitor and is not coupled to the second plate of the bypass capacitor.

15. The method of claim 14, wherein the integrated circuit die further comprises a power supply conductor, and wherein the caposer, the integrated circuit die and the package are assembled such that the power supply conductor is coupled to the first plate of the bypass capacitor, further comprising:
   drawing a current onto the integrated circuit die through the power supply conductor, wherein at least a portion of the current is supplied to the integrated circuit die from the bypass capacitor.

16. The method of claim 14, wherein the integrated circuit die includes a plurality of micro-bumps, wherein the caposer includes a plurality of through-holes, and wherein said assembling is conducted such that each respective one of the micro-bumps of the integrated circuit die extends through a corresponding one of the through-holes of the caposer.

17. The method of claim 14, wherein the integrated circuit die includes a plurality of micro-bumps, wherein the caposer includes a plurality of conductive vias, and wherein said assembling is conducted such that each respective one of the plurality of micro-bumps of the integrated circuit die contacts a corresponding one of the plurality of conductive vias of the caposer.

18. The method of claim 14, wherein the integrated circuit die includes a plurality of lands, and wherein the caposer includes a plurality of solder plugs, and wherein the assembling is conducted such that each respective one of the plurality of lands of the integrated circuit die contacts a corresponding one of the plurality of solder plugs of the caposer.

19. A structure, comprising:

an integrated circuit die having a signal conductor;

an integrated circuit package housing the integrated circuit die, a landing pad being disposed on an inside surface of the integrated circuit package; and means for supplying a bypass capacitor within the integrated circuit package such that the signal conductor of the integrated circuit die is coupled to the landing pad of the integrated circuit without being coupled to the bypass capacitor.

20. The structure of claim 19, wherein the means is disposed between the integrated circuit die and the inside surface of the integrated circuit package, wherein the integrated circuit die has a power conductor, wherein the bypass capacitor has a first conductive plate and a second conductive plate, and wherein the power conductor is coupled to the first conductive plate.

21. A structure having a rectangular tile shape, a rectangular upper surface and rectangular bottom surface, the structure comprising:

a first conductive plate;

a second conductive plate disposed parallel to the first conductive plate; and a dielectric layer disposed between the first conductive plate and the second conductive plate, wherein each through-hole of a plurality of through-holes extends through the structure from the rectangular upper surface, through the first conductive plate, through the dielectric layer, through the second conductive plate and to the rectangular bottom surface, wherein each of the through-holes has an inside surface, wherein neither the first conductive plate nor the second conductive plate extends to the inside surface of at least one of the through-holes, and wherein the tile-shaped structure is less than 100 microns thick.

* * * * *